(12) United States Patent
Shihara et al.

(10) Patent No.: US 6,680,887 B2
(45) Date of Patent: Jan. 20, 2004

(54) OPTICAL DISK APPARATUS AND PLL CIRCUIT

(75) Inventors: Tetsuya Shihara, Osaka (JP); Takashi Narutani, Ehime (JP); Katsuya Watanabe, Nara (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 411 days.

(21) Appl. No.: 09/853,086

(22) Filed: May 10, 2001

(65) Prior Publication Data

US 2002/0044506 A1 Apr. 18, 2002

(30) Foreign Application Priority Data

May 15, 2000 (JP) .................................... 2000-141495

(51) Int. Cl.[7] .............................................. G11B 7/00
(52) U.S. Cl. .......................... 369/44.32; 369/59.17; 369/53.19; 369/59.19
(58) Field of Search .................. 369/44.32, 44.29, 369/44.35, 44.34, 53.13, 53.15, 53.16, 53.17, 53.19, 53.35, 59.21, 59.22, 59.17, 59.19, 47.17, 47.18, 47.44, 47.45, 47.28

(56) References Cited

U.S. PATENT DOCUMENTS

| | | | | |
|---|---|---|---|---|
| 5,848,036 A | * | 12/1998 | Ishibashi et al. | 369/44.29 |
| 5,898,654 A | * | 4/1999 | Shimada et al. | 369/44.32 |
| 6,100,724 A | * | 8/2000 | Yoshimura et al. | 369/53.34 |
| 6,324,145 B1 | * | 11/2001 | Kobayashi et al. | 369/59.17 |
| 6,381,203 B1 | * | 4/2002 | Muramatsu | 369/47.17 |
| 6,526,007 B1 | * | 2/2003 | Fujita | 369/44.32 |

FOREIGN PATENT DOCUMENTS

JP 10-69657 3/1998

* cited by examiner

Primary Examiner—Thang V. Tran
(74) Attorney, Agent, or Firm—Renner, Otto, Boisselle & Sklar

(57) ABSTRACT

This invention relates to an optical disk apparatus for optically reproducing information recorded on an information carrier by an optical beam emitted by a light source, the optical disk apparatus comprising: a converging section for directing the optical beam to the information carrier in a converged state; a light detection section for generating a reproduction signal corresponding to the optical beam reflected by or transmitted through the information carrier; a waveform equalization section for varying a frequency characteristic of the reproduction signal generated by the light detection section; a jitter measuring section for measuring a jitter of a signal output from the waveform equalization section; and a minimum jitter value searching section for determining a minimum value of the jitter in an initial area of an X-Y plane defined by a variable x and a variable y which can vary the jitter measured by the jitter measuring section. A PLL circuit is disclosed.

20 Claims, 28 Drawing Sheets

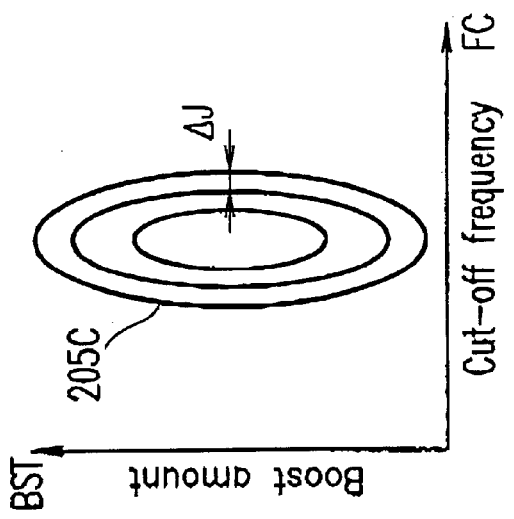
FIG.2A
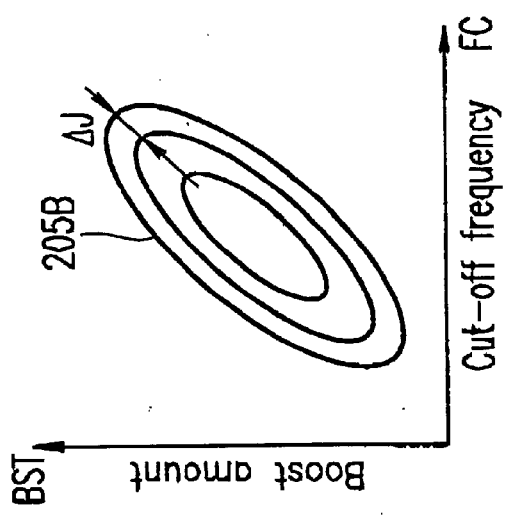
FIG.2B
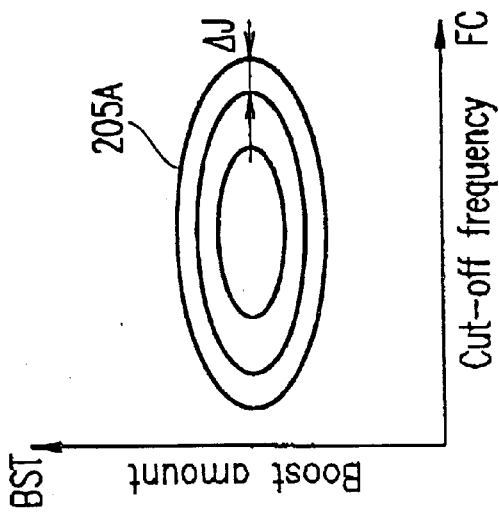
FIG.2C
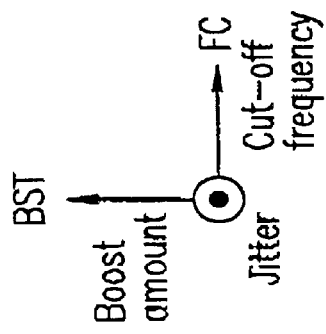

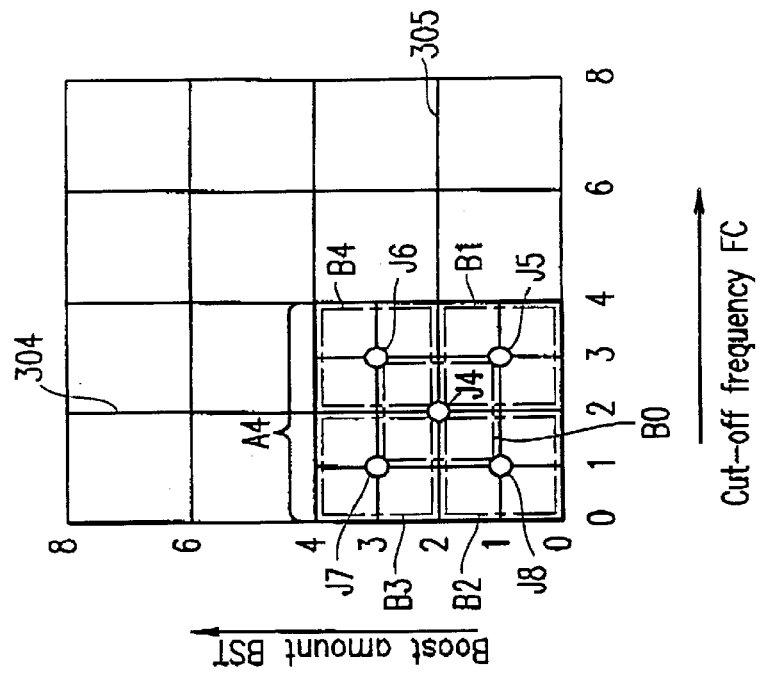
FIG.3B
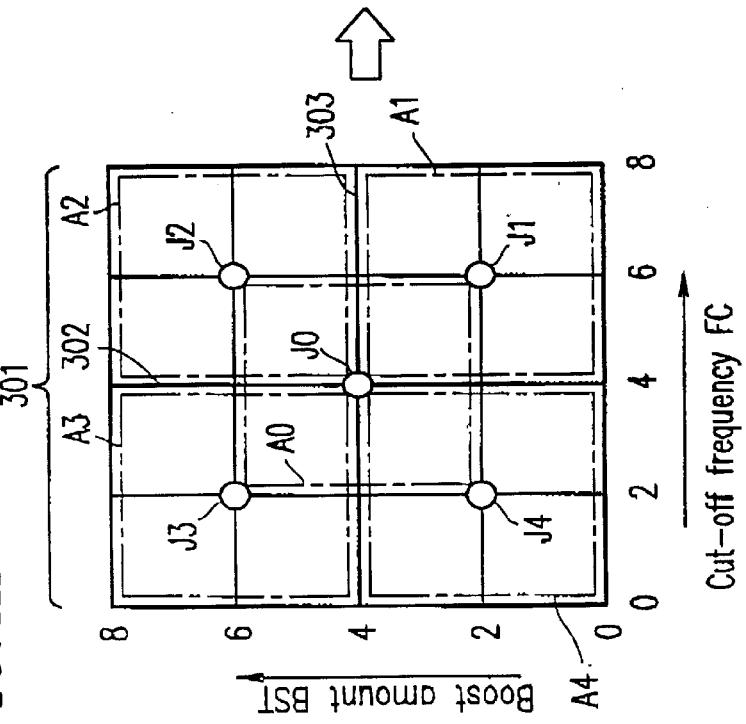
FIG.3A
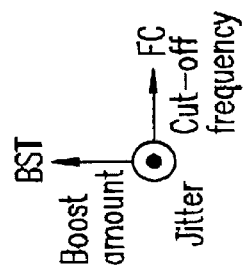

FIG. 4
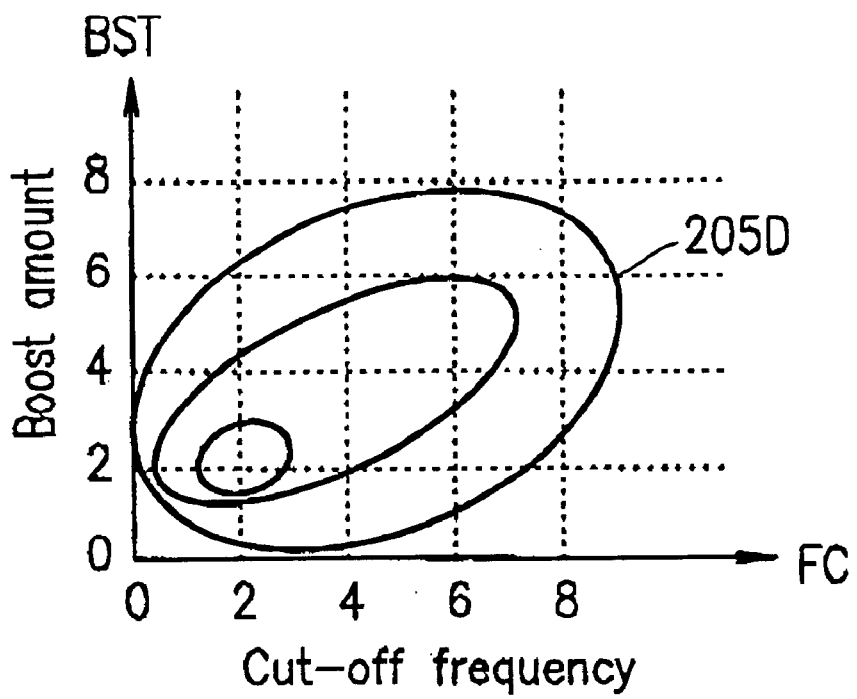
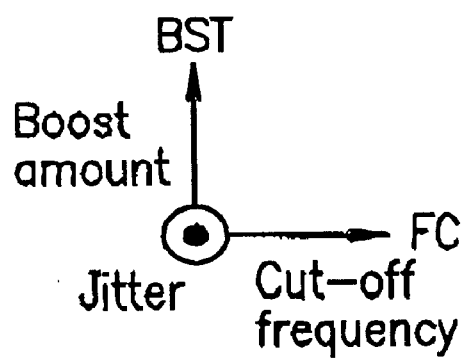

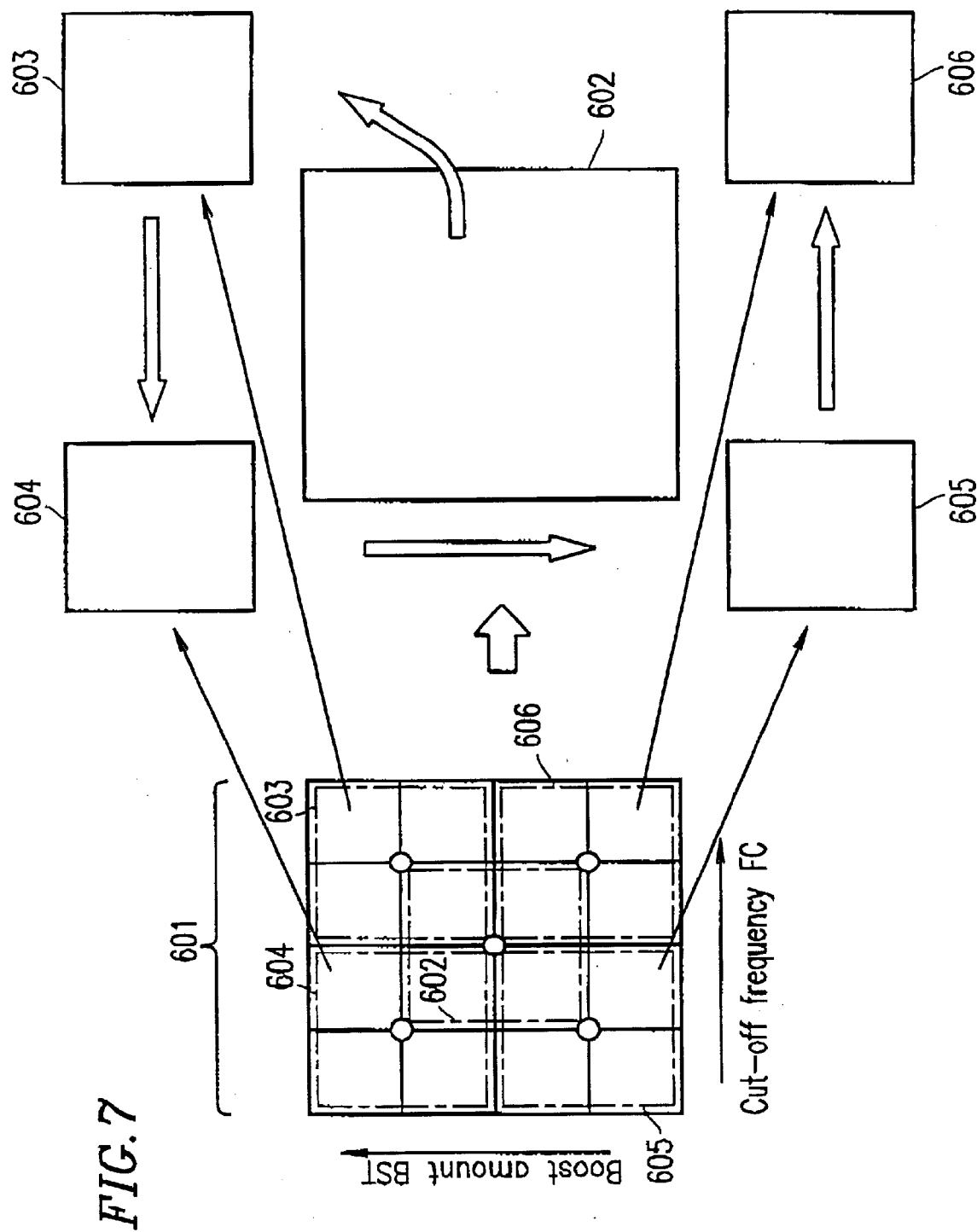

FIG.11
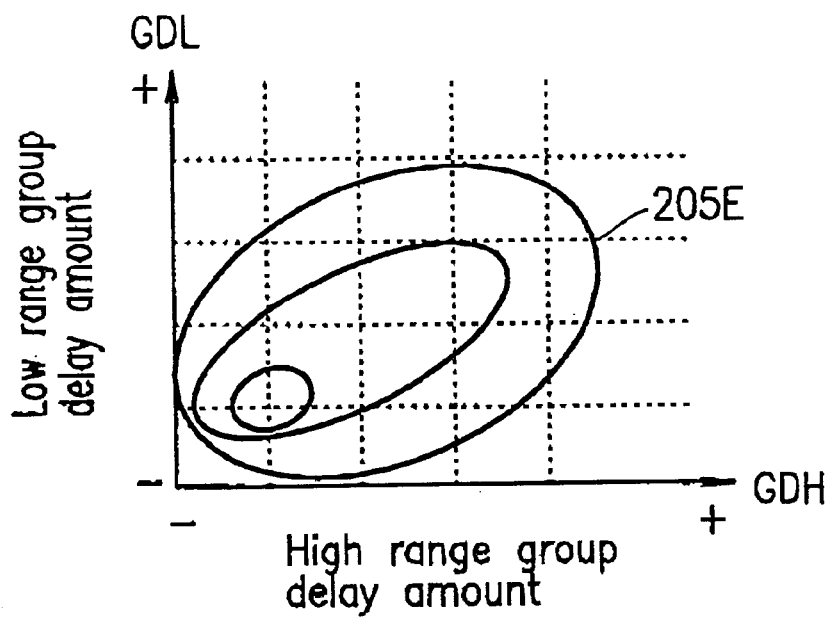
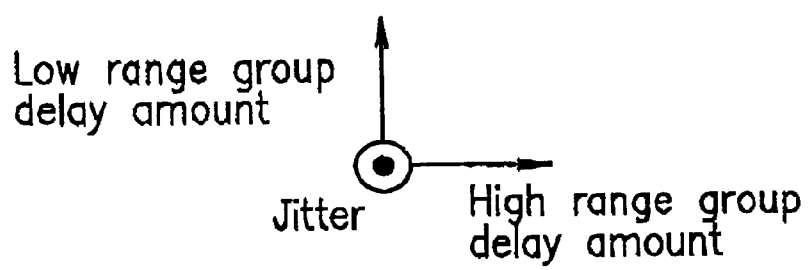

FIG. 13
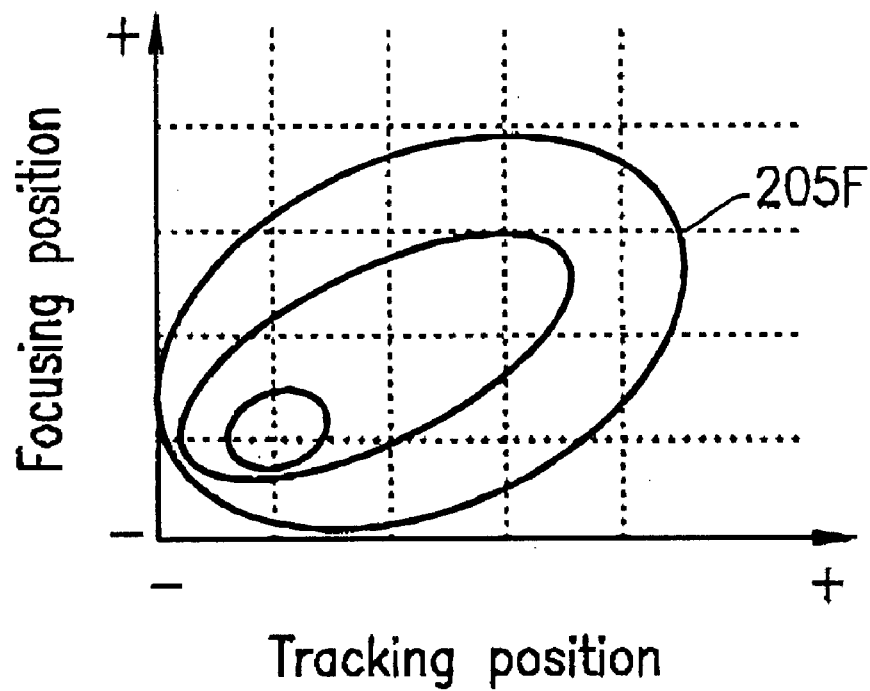
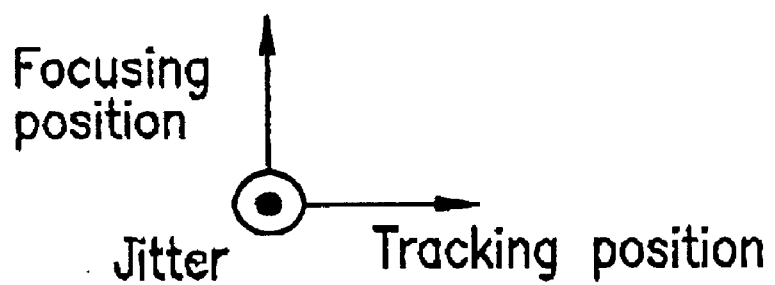

θr: Radial tilt (x-z plane)
θt: Tangential tilt (y-z plane)

Coordinate system on the disk

FIG.16
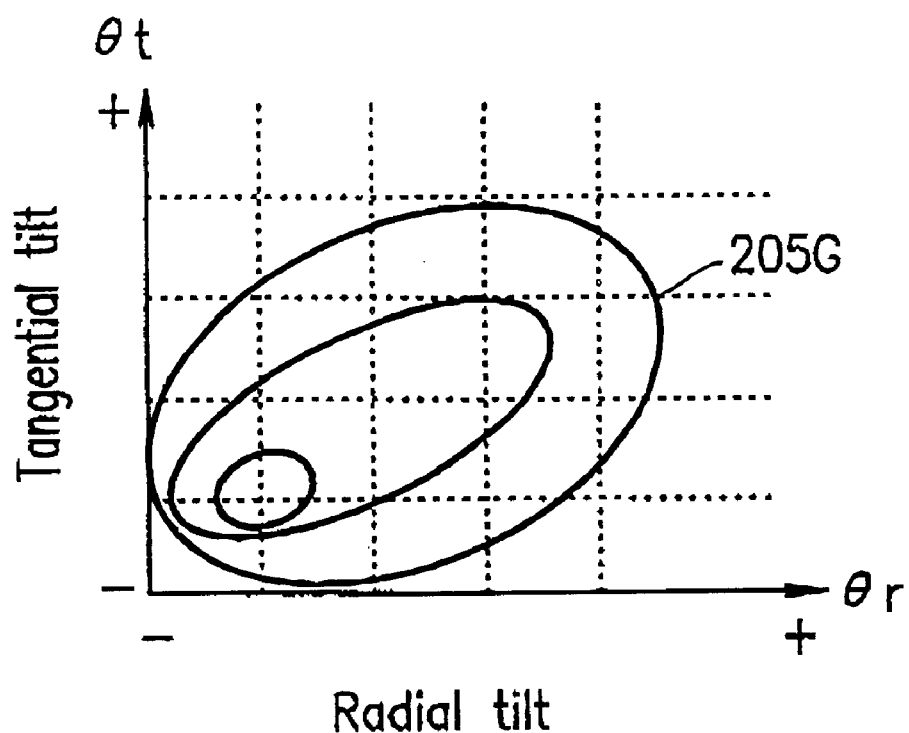
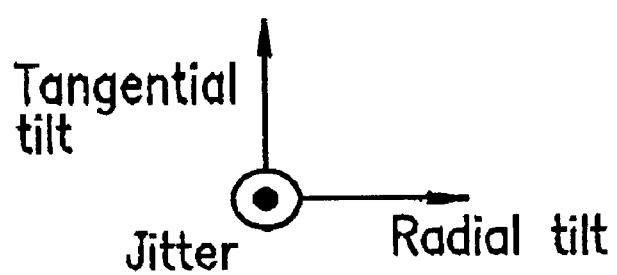

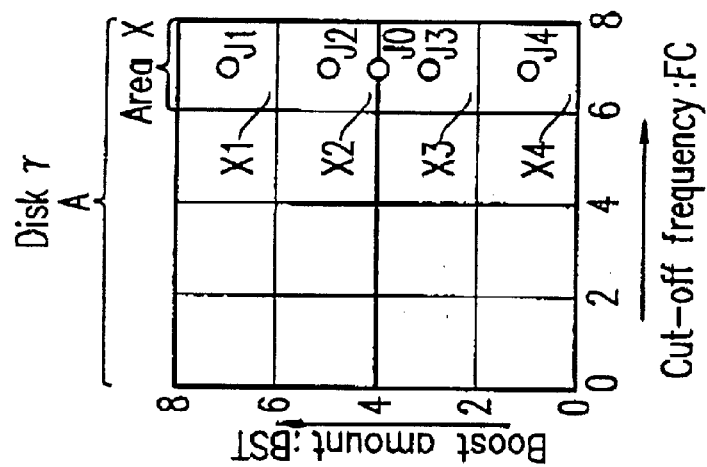
FIG.19C
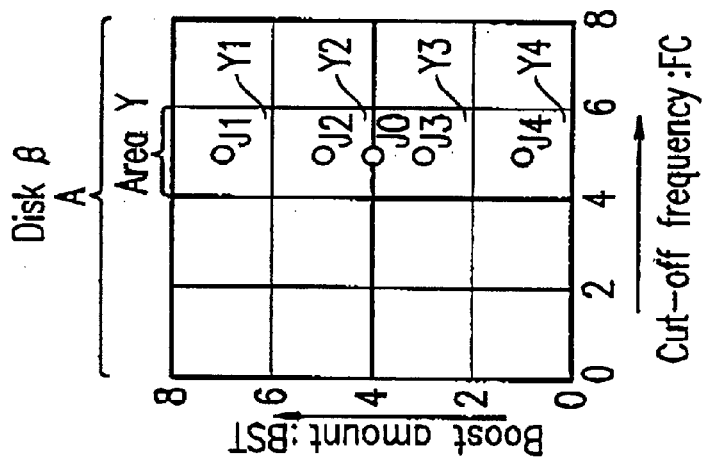
FIG.19B
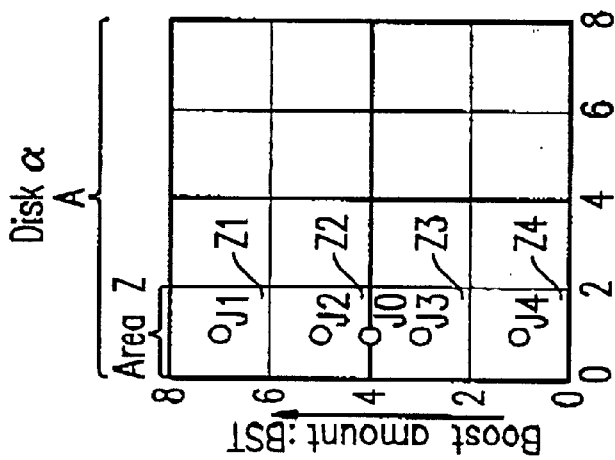
FIG.19A
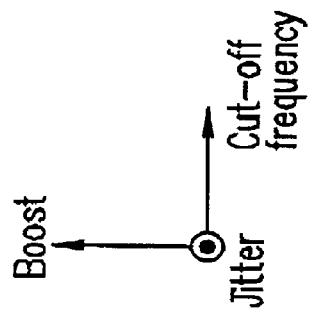

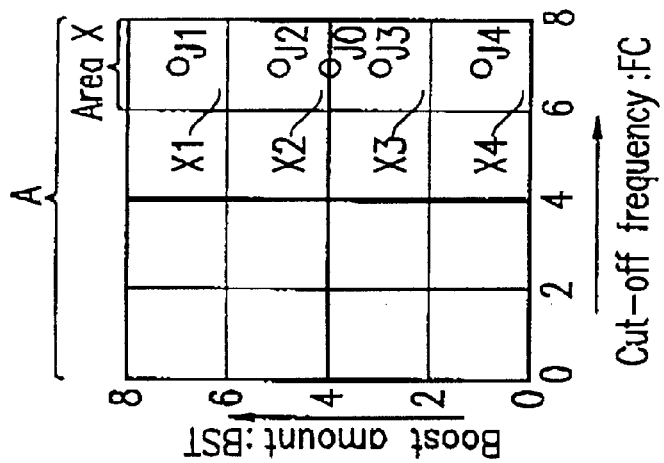
FIG.22C Outer portion
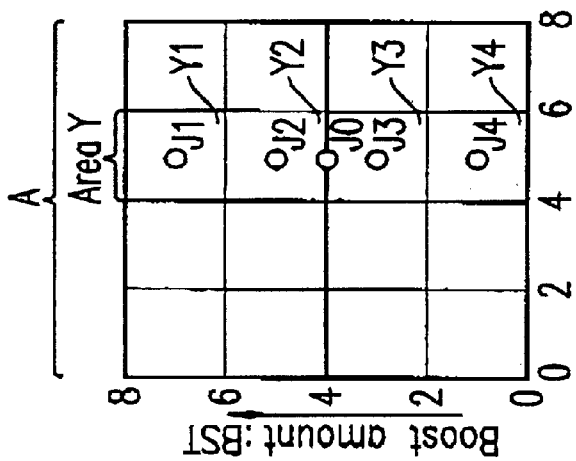
FIG.22B Middle portion
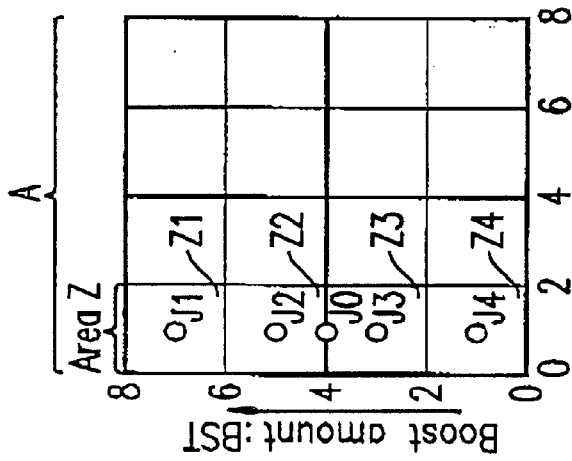
FIG.22A Inner portion
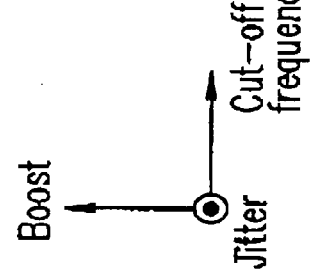

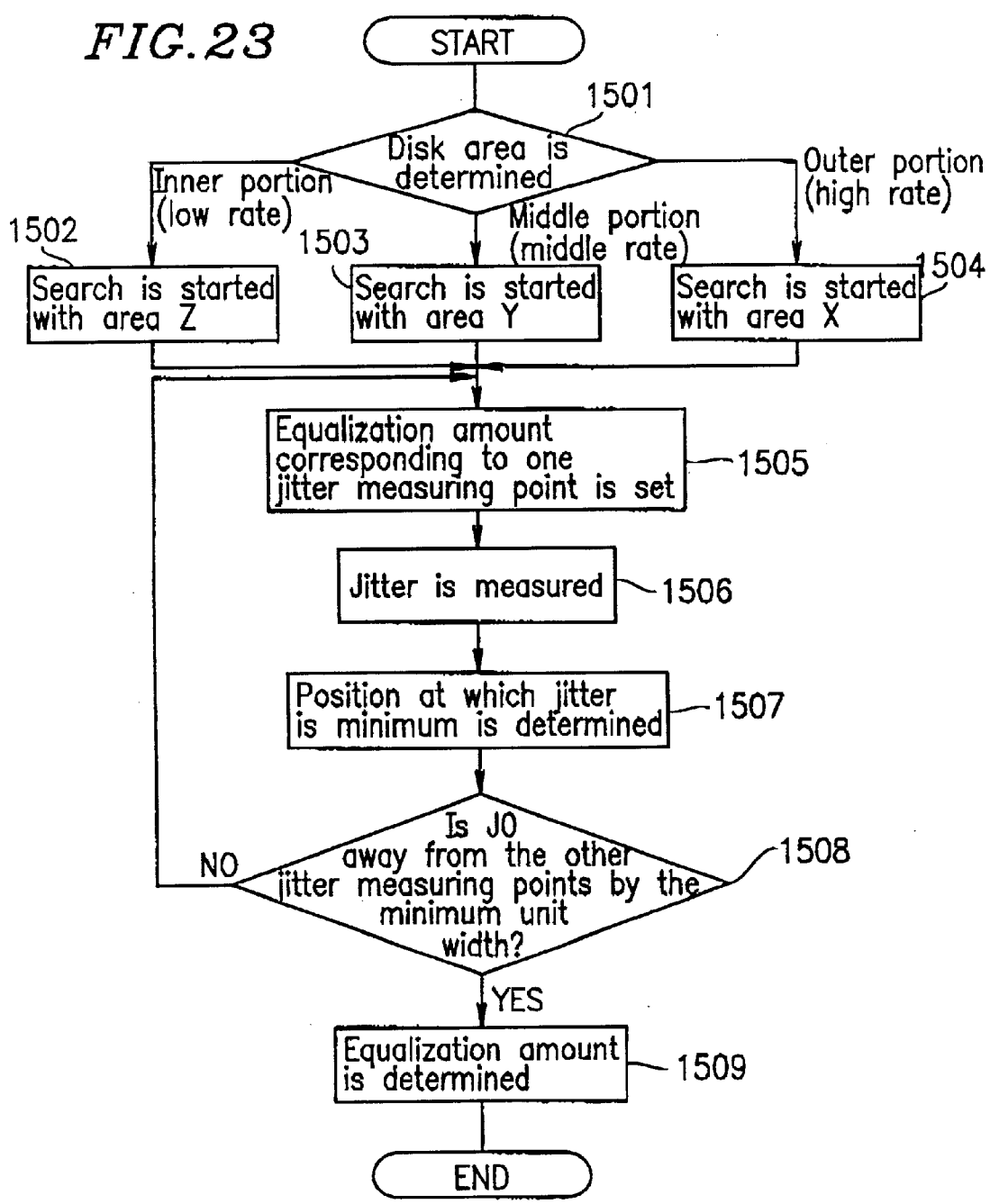

FIG.25
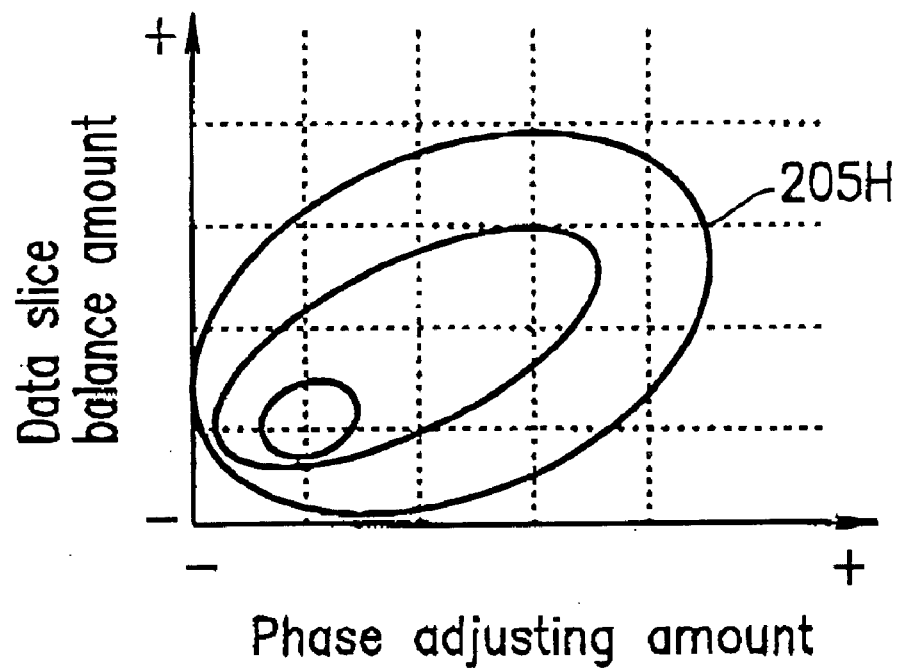
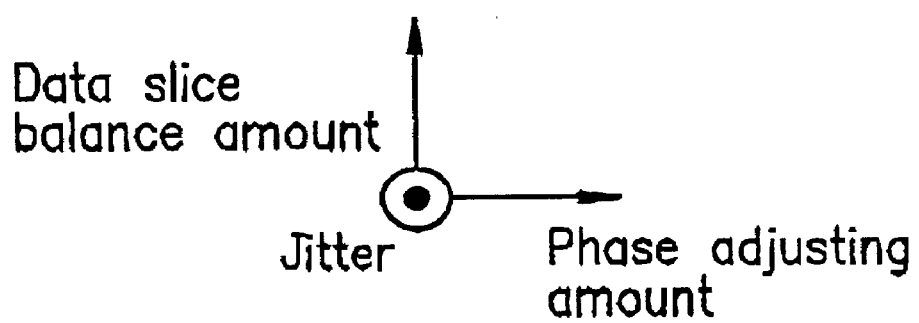

OPTICAL DISK APPARATUS AND PLL CIRCUIT

BACKGROUND OF THE INVENTION

1. Field of the Invention

The present invention relates to an optical disk apparatus for optically reproducing a signal on an information carrier utilizing an optical beam from a light source, such as, for example, a semiconductor laser, and a PLL circuit for removing an off set in a data slice balance circuit.

2. Description of the Related Art

One type of optical disk apparatus reproduces a signal by directing an optical beam generated by a light source, such as a semiconductor laser on a circular information carrier (for example, an optical disk), in a converged state, rotating at a prescribed rotation rate. The information carrier has a very narrow spiral track including information pit arrays. An optical disk apparatus generally performs three types of controls, namely, rotation control for rotating an optical disk at a prescribed rotation rate, focusing control for directing an optical beam on the optical disk in a converged state, and tracking control for controlling the optical beam to correctly scan the track on the optical disk.

There are various types of optical disks including reproduction-only disks, such as CD-audio, CD-ROM and DVD-ROM, having information recorded in pit arrays, once-recordable disks, such as CD-R and DVD-R, and recording and reproduction disks, such as CD-RW, DVD-RAM and DVD-RW. The recording density, the reflectance of the disk and the type of reproduction signal vary in accordance with the type of disk. Accordingly, it is required that the optical disk apparatus optimizes the reproduction method so as to be suitable for the features of each type of disk. Specifically, in order to reproduce two or more types of disks or switch the reproduction rate, the optical disk apparatus conventionally optimizes the reproduction method by adapting the frequency characteristics of a waveform equalizer included in the optical disk apparatus.

FIG. 27 is a graph illustrating the relationship between the gain, noise and frequency of a waveform equalizer. A reproduction signal from the optical disk is a random signal, but a signal component having a higher frequency has a drastically reduced gain due to inter-code interference, as compared to a signal component having a lower frequency. Accordingly, as shown in FIG. 27, a prescribed frequency of the reproduction signal is boosted by the waveform equalizer so as to improve the gain of the signal component having a higher frequency, and further the gain is rapidly reduced by a higher-order equal ripple filter or the like so as to remove noise in a frequency band which is higher than the prescribed frequency FC.

FIG. 28 is a graph illustrating a jitter characteristic with respect to a focusing position. When the focusing position is shifted from the optimum position (indicated as the "just focusing position 2701" in FIG. 28), the jitter is increased. This occurs since the gain of the reproduction signal is reduced as shown in FIG. 27 and thus the S/N ratio of the reproduction signal is lowered, resulting in deterioration of the quality of the reproduction signal. In order to detect the jitter and determine the optimum frequency of the waveform equalizer at which the jitter is minimum, the focusing position needs to be kept at the just focusing position 2701.

As a technology to realize this, Japanese Laid-Open Publication No. 10-69657 discloses measuring the jitter of a waveform-equalized reproduction signal and two-dimensionally varying the focusing position and a cut-off frequency of the waveform equalizer so as to find the optimum focusing position and cut-off frequency at which the jitter is minimum.

In a conventional optical disk apparatus having the above-described function, the quality of the reproduction signal is kept high by executing all combinations of the values of two parameters, for example, the focusing position and the cut-off frequency, and measuring the jitter at each combination so as to find the optimum combination at which the jitter is minimum.

However, as it becomes necessary to reproduce more types of media or optical disks, the above conventional method is not always successful. Especially when reproducing recordable disks, such as CD-R, CD-RW, DVD-R, DVD-RW and DVD-RAM, the jitter is not reduced unless the focusing position is adjusted separately from the cut-off frequency in order to find the cut-off frequency and boost amount.

In addition, as the reproduction rate of the disks is varied, it is necessary to reproduce signals of a greater number of frequency bands in order to deal with, for example, CDs of the standard rate to 48x and DVDs of the standard rate to 16x. It is not appropriate to execute all of the combinations of the parameters of the reproduction rate and find the optimum combination at which the jitter is minimum each time an optical disk apparatus starts operation, since this results in the start-up time becoming unbearably long. It is also not appropriate to execute all of the combinations of the parameters of the reproduction rate and find the optimum combination at which the jitter is minimum each time the reproduction rate is changed, since this results in it being impossible to read the signal immediately.

SUMMARY OF THE INVENTION

According to one aspect of the invention, an optical disk apparatus, for optically reproducing information recorded on an information carrier by an optical beam emitted by a light source, includes a converging section for directing the optical beam to the information carrier in a converged state; a light detection section for generating a reproduction signal corresponding to the optical beam reflected by or transmitted through the information carrier; a waveform equalization section for varying a frequency characteristic of the reproduction signal generated by the light detection section; a jitter measuring section for measuring a jitter of a signal output from the waveform equalization section; and a minimum jitter value searching section for determining a minimum value of the jitter in an initial area of an X-Y plane defined by a variable x and a variable y which can vary the jitter measured by the jitter measuring section. The minimum jitter value searching section divides the initial area into a plurality of first divided areas having an identical shape to each other, each of which has a respective first jitter measuring point at the center of gravity thereof; and performs a search operation to find one of the plurality of first divided areas which has the first jitter measuring point at which a minimum jitter is measured among the first jitter measuring points. The minimum jitter value searching section divides the first divided area, having the first jitter measuring point at which the jitter is minimum, obtained by the search operation into a plurality of second divided areas having an identical shape to each other, each of which has a respective second jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second jitter measuring point at which the jitter is minimum found by the search operation.

In one embodiment of the invention, the minimum jitter value searching section divides the initial area into four first divided areas having an identical shape to each other, each of which has a respective first jitter measuring point at the center of gravity thereof; and performs a search operation to find one of the four divided areas which has the first jitter measuring point at which a minimum jitter is measured among the first jitter measuring points. The minimum jitter value searching section divides the first divided area obtained by the search operation into four second divided areas having an identical shape to each other, each of which has a respective second jitter measuring point at the center of gravity thereof; and performs a search operation to find one of the four second divided areas which has the second jitter measuring point at which a minimum jitter is measured among the second jitter measuring points.

In one embodiment of the invention, when a value of the jitter measured by the jitter measuring section is equal to or less than a prescribed value, the minimum jitter value searching section terminates the search operation.

In one embodiment of the invention, when the jitter measuring section is incapable of measuring the jitter in at least one of the first divided areas or at least one of the second divided areas, the jitter measuring section performs a search operation to find one of the plurality of first divided areas or one of the plurality of second divided areas which has the first or second jitter measuring point at which a minimum jitter is measured among the first or second jitter measuring points except for the area in which the jitter is incapable of being measured.

In one embodiment of the invention, the variable x includes a cut-off frequency, and the variable y includes a boost amount.

In one embodiment of the invention, the variable x includes a high frequency range group delay amount, and the variable y includes a low frequency range group delay amount.

In one embodiment of the invention, the optical disk apparatus further includes a focusing control section for controlling the converging section so that the optical beam is converged on the information carrier in a prescribed converged state; and a tracking control section for controlling the converging section so that the optical beam correctly scans a track on the information carrier. The variable x includes a tracking position, and the variable y includes a focusing position.

In one embodiment of the invention, the optical disk apparatus further includes a radial tilt adjusting section for adjusting a radial tilt of the optical beam with respect to a surface of the information carrier; and a tangential tilt adjusting section for adjusting a tangential tilt of the optical beam with respect to the surface of the information carrier. The variable x includes a radial tilt, and the variable y includes a tangential tilt.

According to another aspect of the invention, an optical disk apparatus, for optically reproducing information recorded on an information carrier by an optical beam emitted by a light source, includes a converging section for directing the optical beam to the information carrier in a converged state; a light detection section for generating a reproduction signal corresponding to the optical beam reflected by or transmitted through the information carrier; a waveform equalization section for varying a frequency characteristic of the reproduction signal generated by the light detection section; a jitter measuring section for measuring a jitter of a signal output from the waveform equalization section; a minimum jitter value searching section for determining a minimum value of the jitter in an initial area of an X-Y plane defined by a variable x and a variable y which can vary the jitter measured by the jitter measuring section; and an information carrier determination section for determining the type of the information carrier. The minimum jitter value searching section divides the initial area into a plurality of first divided areas having an identical shape to each other, and selects one of the plurality of first divided areas based on the type of the information carrier determined by the information carrier determination section. The minimum jitter value searching section divides the selected first divided area into a plurality of second divided areas having an identical shape to each other, each of which has a respective jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second jitter measuring point at which the jitter is minimum, found by the search operation.

In one embodiment of the invention, the minimum jitter value searching section divides the initial area into four first divided areas having an identical rectangular shape to each other, and selects one of the four first divided areas based on the type of the information carrier determined by the information carrier determination section. The minimum jitter value searching section divides the selected first divided area into four second divided areas having an identical square shape to each other, each of which has a respective jitter measuring point at the center of gravity thereof; and performs a search operation to find one of the four second divided areas which has the second jitter measuring point at which a minimum jitter is measured among the second jitter measuring points.

In one embodiment of the invention, the variable x includes a cut-off frequency, and the variable y includes a boost amount.

In one embodiment of the invention, the variable x includes a high frequency range group delay amount, and the variable y includes a low frequency range group delay amount.

In one embodiment of the invention, the optical disk apparatus further includes a focusing control section for controlling the converging section so that the optical beam is converged on the information carrier in a prescribed converged state; and a tracking control section for controlling the converging section so that the optical beam correctly scans a track on the information carrier. The variable x includes a tracking position, and the variable y includes a focusing position.

In one embodiment of the invention, the optical disk apparatus further includes a radial tilt adjusting section for adjusting a radial tilt of the optical beam with respect to a surface of the information carrier; and a tangential tilt adjusting section for adjusting a tangential tilt of the optical beam with respect to the surface of the information carrier.

The variable x includes a radial tilt, and the variable y includes a tangential tilt.

According to still another aspect of the invention, an optical disk apparatus, for optically reproducing information recorded on an information carrier by an optical beam emitted by a light source, includes a converging section for directing the optical beam to the information carrier in a converged state; a light detection section for generating a reproduction signal corresponding to the optical beam reflected by or transmitted through the information carrier; a waveform equalization section for varying a frequency characteristic of the reproduction signal generated by the light detection section; a jitter measuring section for measuring a jitter of a signal output from the waveform equalization section; a minimum jitter value searching section for determining a minimum value of the jitter in an initial area of an X-Y plane defined by a variable x and a variable y which can vary the jitter measured by the jitter measuring section; and a reproduction rate detection section for detecting a reproduction rate of a reproduction signal. The minimum jitter value searching section divides the initial area into a plurality of first divided areas having an identical shape to each other, and selects one of the plurality of first divided areas based on the reproduction rate detected by the reproduction rate detection section. The minimum jitter value searching section divides the selected first divided area into a plurality of second divided areas having an identical shape to each other, each of which has a respective jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second measuring point at which the jitter is minimum, found by the search operation.

In one embodiment of the invention, the minimum jitter value searching section divides the initial area into four first divided areas having an identical rectangular shape to each other, and selects one of the four first divided areas based on the reproduction rate detected by the reproduction rate detection section. The minimum jitter value searching section divides the selected first divided area into four second divided areas having an identical square shape to each other, each of which has a respective jitter measuring point at the center of gravity thereof; and performs a search operation to find one of the four second divided areas which has the second jitter measuring point at which a minimum jitter is measured among the second jitter measuring points.

In one embodiment of the invention, the variable x includes a cut-off frequency, and the variable y includes a boost amount.

According to still another aspect of the invention, a PLL circuit includes a reference signal generation section for generating a monotonic signal; a level-slicing section for level-slicing the monotonic signal, a data slice balance setting section for setting an operation of the level-slicing section so as to level-slice a center of an amplitude of the monotonic signal; a clock generation section for generating a clock signal; a-phase comparison section for comparing a phase of the monotonic signal which is level-sliced by the level-slicing section and a phase of the clock signal generated by the clock generation section so as to output a phase error signal; a charge pump circuit for averaging the phase error signal output by the phase comparison section; a phase adjusting section for adjusting a phase shift of the phase error signal output by the phase comparison section; a jitter measuring section for measuring a jitter based on the phase error signal output by the phase comparison section; and a minimum jitter value searching section for determining a minimum value of the jitter in an initial area in an X-Y plane defined by a variable x and a variable y which can vary the jitter measured by the jitter measuring section. The minimum jitter value searching section divides the initial area into a plurality of first divided areas having an identical shape to each other, each of which has a respective first jitter measuring point at the center of gravity thereof; and performs a search operation to find one of the plurality of first divided areas which has the first jitter measuring point at which a minimum jitter is measured among the first jitter measuring points. The minimum jitter value searching section divides the first divided area, having the first jitter measuring point at which the jitter is minimum, obtained by the search operation into a plurality of second divided areas having an identical shape to each other, each of which has a respective second jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which correspond to the second divided area, having the second measuring point at which the jitter is minimum, found by the search operation.

In one embodiment of the invention, the variable x includes a cut-off frequency, and the variable y includes a boost amount.

In one embodiment of the invention, the phase adjusting section varies a current balance at an output stage included in the charge pump circuit so as to adjust the phase shift of the phase error signal which is output from the phase comparison section.

Thus, the invention described herein makes possible the advantages of providing (1) a highly reliable and high-speed optical disk apparatus for reproducing information stored on a plurality of types of optical disks, capable of switching the reproduction rate among a plurality of stages, which can shorten start-up time and read time; and (2) an optical disk apparatus and a PLL circuit for efficiently and rapidly determining the combination of parameters at which the jitter is minimum.

These and other advantages of the present invention will become apparent to those skilled in the art upon reading and understanding the following detailed description with reference to the accompanying figures.

BRIEF DESCRIPTION OF THE DRAWINGS

FIGS. 2A, 2B and 2C are graphs illustrating the relationship between the cut-off frequency, the boost amount and the jitter contour in the first example;

FIGS. 3A and 3B show a method for searching for an area where the jitter is minimum in the first example;

FIG. 4 is a graph illustrating an area having the minimum jitter value in the first example;

FIG. 7 illustrates the order of areas in which the jitter is measured in the first example;

FIG. 11 is a graph illustrating the relationship between the low range group delay amount, the high range group delay amount, and the jitter contour in the first example;

FIG. 13 is a graph illustrating the relationship between the tracking position, the focusing position, and the jitter contour in the first example;

FIG. 16 is a graph illustrating the relationship between the radial tilt, the tangential tilt, and the jitter contour in the first example;

FIGS. 19A, 19B and 19C show a method for searching for an area where the jitter is minimum in the second example;

FIGS. 22A, 22B and 22C show a method for searching for an area where the jitter is minimum in the third example;

FIG. 23 is a flowchart illustrating a method for searching for an area where the jitter is minimum in the third example;

FIG. 25 is a graph illustrating the relationship between the phase adjusting amount, the data slice balance amount, and the jitter contour in the fourth example;

DESCRIPTION OF THE EMBODIMENTS

Figure 1:
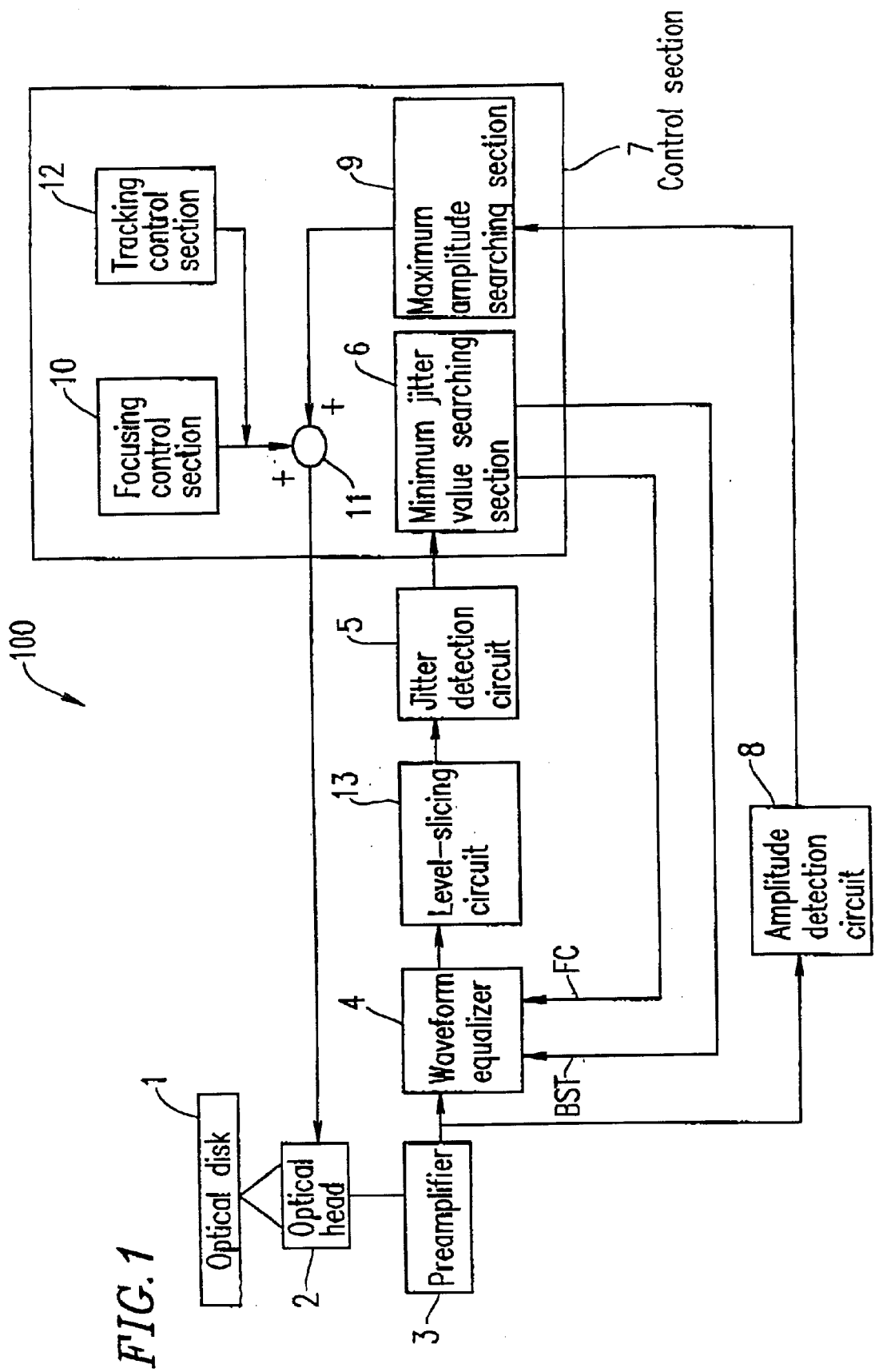
FIG. 1 is a block diagram illustrating an optical disk apparatus in a first example according to the present invention.

Hereinafter, the present invention will be described by way of illustrative examples with reference to the accompanying drawings. In the figures, identical elements bear identical reference numerals.

EXAMPLE 1

FIG. 1 is a block diagram illustrating a structure of an optical disk apparatus 100 according to a first example of the present invention.

In the operations performed by the optical disk apparatus 100, an optimum combination of the cut-off frequency and a boost amount it determined as follows. Variables x and y are given as variables which can vary jitter, and the optimum combination of X and Y at which the jitter is minimum is determined. In order to simplify the description, variable x represents the cut-off frequency, and variable y represents the boost amount in this example. An X-Y plane defined by variables x and y is divided at a prescribed rate into a plurality of first areas. Among the plurality of first areas, the area in which the jitter is minimum is determined. The determined first area is further divided into a plurality of second areas. Among the plurality of second areas, the area in which the jitter is minimum is determined. By repeating this procedure, the optimum combination of the cut-off frequency and the boost amount is determined.

As shown in FIG. 1, the optical disk apparatus 100 includes an optical head 2 for directing an optical beam generated by a light source, such as, for example, a semiconductor laser to an optical disk 1 as an information carrier in a converged state, a preamplifier 3 for amplifying a reproduction signal corresponding to light reflected by the optical disk 1 and output by the optical head 2, a waveform equalizer 4 for waveform-equalizing the reproduction signal amplified by the preamplifier 3, a level-slicing circuit 13 for level-slicing the reproduction signal waveform-equalized by the waveform equalizer 4, a jitter detection circuit 5 for detecting the jitter of the reproduction signal which has been level-sliced by the level-slicing circuit 13, an amplitude detection circuit 8 for detecting the amplitude of the reproduction signal amplified by the preamplifier 3, and a control section 7 for controlling the optical head 2 so that the optical beam directed from the optical head 2 to the optical disk 1 is in a converged state.

The control section 7 includes a minimum jitter value searching section 6 for searching for the minimum value of the jitter detected by the jitter detection circuit 5, a maximum amplitude searching section 9 for searching for a focusing position at which the amplitude of the reproduction signal detected by the amplitude detection circuit 8 is maximum, a focusing control section 10 for executing focusing control so that the optical beam from the optical head 2 is in an optimum converged state on the optical disk 1, a tracking control section 12 for executing tracking control so that the optical beam from the optical head 2 correctly scans the track on the optical disk 1, and a synthesis circuit 11 for synthesizing a signal from the maximum amplitude searching section 9 with a focusing control signal from the focusing control section 10 and a tracking control signal from the tracking control section 12.

The optical disk apparatus 100 operates, for example, in the following manner.

The amplitude detection circuit 8 detects an amplitude of a reproduction signal amplified by the preamplifier 3 so as to set a target position of the focusing control section 10 (i.e., a focusing position) at which the optical beam from the optical head 2 is in an optimum converged state on the optical disk 1. The control section 7 includes the tracking control section 12, but tracking control is not directly relevant to the present invention and will not be described in detail.

The reproduction signal waveform-equalized by the waveform equalizer 4 is level-sliced by the level-slicing circuit 13, and the jitter of the level-sliced reproduction signal is detected by the jitter detection circuit 5. The jitter detection circuit 5 detects the jitter by converting a phase shift between the reproduction signal level-sliced by the level-slicing circuit 13 and a PLL clock which is generated in, for example, the jitter detection circuit 5 into a voltage.

The jitter detected by the jitter detection circuit 5 is sent to the minimum jitter value searching section 6. The minimum jitter value searching section 6 sets the frequency of the waveform equalizer 4 to an optimum value by supplying the waveform equalizer 4 with the optimum combination of a cut-off frequency FC and a boost amount BST at which the jitter is minimum. The information on the optical disk 1 is reproduced as a result of being filtered by the waveform equalizer 4 having the optimally set frequency.

The operation of the minimum jitter value searching section 6 will be described in detail.

The waveform equalizer 4 has a structure of varying the cut-off frequency FC for removing a noise component in a high frequency range of the reproduction signal and the boost amount BST for relatively increasing a high frequency component of the reproduction signal. The waveform equalizer 4 can be structured using an active filter, such as a vessel filter or an equal ripple filter. As described above, the reproduction signal waveform-equalized by the waveform equalizer 4 is level-sliced by the level-slicing circuit 13 and is input to the jitter detection circuit 5. Using the jitter detected by the jitter detection circuit 5, the minimum jitter value searching section 6 sets the cut-off frequency FC and the boost amount BST to values at which the jitter is minimum in the waveform equalizer 4.

In order to describe a minimum jitter value searching method performed by the minimum jitter value searching section 6, the relationship between the cut-off frequency FC, the boost amount BST and the jitter will be described.

FIGS. 2A through 2C are graphs illustrating the relationship between the cut-off frequency FC, the boost amount BST and the jitter contour in the first example. FIGS. 2A through 2C are used to search for the minimum value of the jitter which is defined by the cut-off frequency FC and the boost amount BST of the waveform equalizer 4. The Cartesian coordinate system included in FIG. 2A is defined by the cut-off frequency FC, the boost amount BST and the jitter. In general, the jitter of a reproduction signal from an optical disk is not an independent variable with respect to the cut-off frequency FC or the boost amount BST. The reason is that in the case of a reproduction signal from an optical disk, as the cut-off frequency FC is increased, the noise in the high frequency range is increased, thus increasing the jitter; and as the cut-off frequency FC is decreased, the S/N ratio of the reproduction signal is decreased, thus increasing the jitter. Whether the cut-off frequency FC is increased or decreased, the S/N ratio of the reproduction signal is decreased and thus the jitter is increased. Similar logic is also applicable to the boost amount BST.

The jitter contours 205A (FIG. 2A), 205D (FIG. 2B) and 205C (FIG. 2C) are obtained by connecting points of identical jitter when the cut-off frequency FC and the boost amount BST are varied. FIGS. 2A through 2C each show a plane with the horizontal axis (x axis) being the cut-off frequency FC and the vertical axis (y axis) being the boost amount BST. In FIGS. 2A through 2C, ΔJ represents the jitter contour interval. The jitter characteristic can be estimated by the size of the jitter contour interval ΔJ.

When the correlation between the boost amount BST and the jitter is stronger than the correlation between the cut-off frequency FC and the jitter, the jitter characteristic is as shown by the jitter contour 205A in FIG. 2A. When the correlation between the cut-off frequency FC and the jitter is stronger than the correlation between the boost amount BST and the jitter, the jitter characteristic is as shown by the jitter contour 205C in FIG. 2C. When the correlation between the boost amount BST and the jitter is substantially equal to the correlation between the cut-off frequency FC and the jitter, the jitter characteristic is as shown by the jitter contour 205B in FIG. 2B. As described above, there are many types of optical disks available, and the jitter characteristics are widely varied in accordance with the type of the optical disk.

The optimum equalization amount defined by the optimum combination of the cut-off frequency FC and the boost amount BST can be set in the waveform equalizer 4 as follows. In a plane having the cut-off frequency FC as the horizontal axis and the boost amount BST as the vertical axis, the position at which the jitter is minimum is obtained. Then, the cut-off frequency FC and the boost amount BST corresponding to the obtained position are found.

With reference to FIGS. 3A, 3B, 4 and 5, 6A and 6B, the minimum jitter value searching method in the first example will be described.

FIG. 3A shows an initial area 301 used to determine the position at which the jitter is minimum. The initial area 301 is defined by variable x and variable y. As described above, variable x represents the cut-off frequency FC as the horizontal axis and the boost amount as the vertical axis. For the sake of simplicity, the cut-off frequency FC and the boost amount DST are each variable in 8 steps. The initial area 301 is square, and includes first areas A1, A2, A3 and A4 which are also square. The initial area 301 is equally divided into the first areas A1, A2, A3 and A4. The initial area 301 further includes a first area A0. The first area A0 is square and located at the center of gravity of the initial area 301. The first area A0 overlaps each of the first areas A1, A2, A3 and A4 by a quarter of each first area.

As shown in FIG. 3A, the first areas A0, A1, A2, A3 and A4 respectively have jitter measuring points J0, J1, J2, J3 and J4. The jitter measuring points J0, J1, J2, J3 and J4 are respectively located at the center of gravity of the first areas A0, A1, A2, A3 and A4.

FIG. 3B shows the first area A4 including the jitter measuring point J4. The first area A4 is further divided into a plurality of second areas. The first area A4 includes second areas B1, B2, B3 and B4. The second areas B1, B2, B3 and B4 are square, The first area A4 is equally divided into the second areas B1, B2, B3 and B4. The first area A4 further includes a second area B0. The second area B0 is square and located at the center of gravity of the first area A4. The second area B0 overlaps each of the second areas B1, B2, B3 and B4 by a quarter of each second area.

As shown in FIG. 3B, the second areas B0, B1, B2, B3 and B4 respectively have jitter measuring points J4, J5, J6, J7 and J8. The jitter measuring points J4, J5, J6, J7 and J8 are respectively located at the center of gravity of the second areas B0, B1, B2, B3 and B4.

In the initial area 301, the first areas A1, A2, A3 and A4 are divided from each other along bold lines 302 and 303 which cross each other perpendicularly at value 4 of the cut-off frequency PC and value 4 of the boost amount BST. Thus, the jitter measuring points J1, J2, J3 and J4 are determined. The jitter is measured at the jitter measuring points J1, J2, J3 and J4, and the first area having the smallest jitter is determined among the four first areas A1, A2, A3 and A4. When the jitter is equal at the four measuring points J1, J2, J3 and J4, the first area having the smallest jitter cannot be determined.

In such a case, the jitter is also measured at the jitter measuring point J0, which contacts all the first areas A1, A2, A3 and A4. When the jitter is equal at all five jitter measuring points J0, J1, J2, J3 and J4, the values of the cut-off frequency FC and the boost amount BST at the jitter measuring point J0 are determined as the optimum values.

The jitter in the initial area 301 is shown by the jitter contour 205D shown in FIG. 4. According to the jitter characteristic shown by the jitter contour 205D, the jitter is minimum at the jitter measuring point J4 among the jitter measuring points J1, J2, J3 and J4.

Then, in the first area A4 corresponding to the jitter measuring point J4, the second areas B1, B2, B3 and B4 are divided from each other along lines 304 and 305 which cross each other perpendicularly at value 2 of the cut-off frequency FC and value 2 of the boost amount BST. Thus, the jitter measuring points J3, J5, J6, J7 and J8 are determined. The jitter is measured at the jitter measuring points J5, J6, J7 and J8, and the second area having the smallest jitter is determined among the four second areas B1, B2, B3 and B4. According to the jitter characteristic shown in FIG. 4, the jitter is minimum at the jitter measuring point J4. The reason is that the distance in the x direction and the y direction between the jitter measuring point J4 and each of the jitter measuring points J5, J6, J7 and J8 is 1, which is the minimum unit width. The optimization of the frequency characteristic is performed by setting the cut-off frequency FC and the boost amount BST corresponding to the jitter measuring point J4.

Figure 6B:
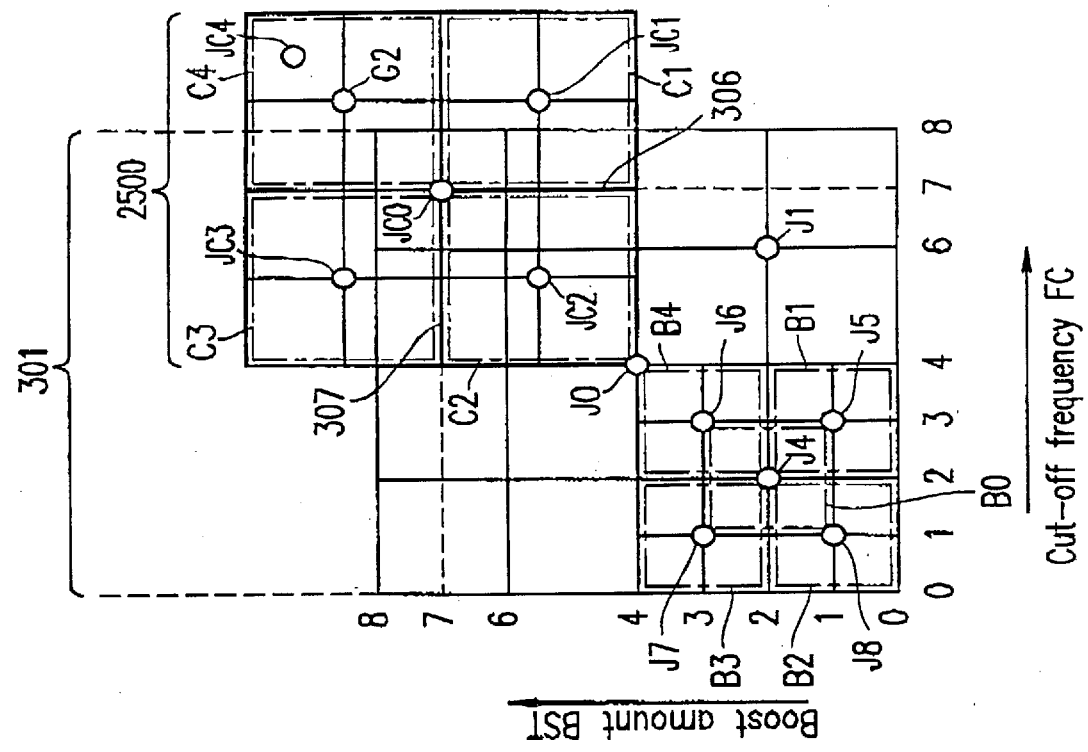
FIGS. 6A and 6B illustrate jitter measuring points used by the method for searching for an area where the jitter it minimum in the first example.
Figure 6A:
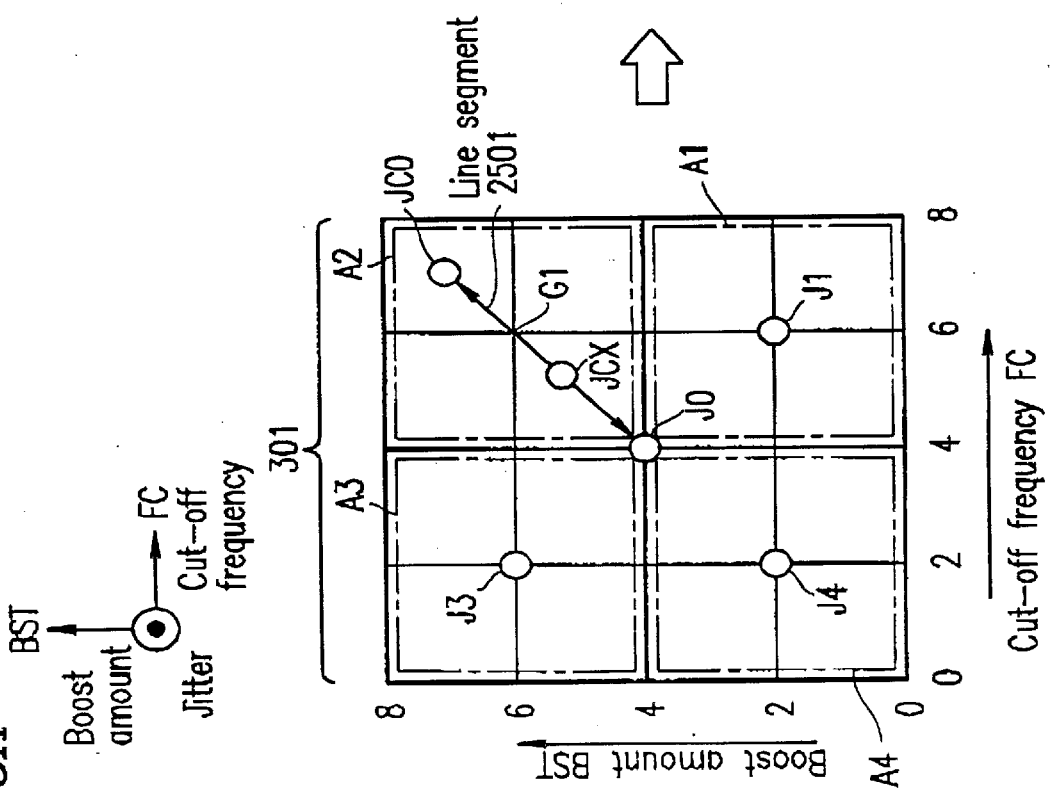

With reference to FIGS. 6A and 6B, the relationship between a method for area division in order to find an area having the minimum jitter value and the jitter measuring points will be described.

FIGS. 6A and 6B illustrate the jitter measuring points used for finding an area having the minimum jitter value. All of the jitter measuring points J0 through J4 in the initial area 301 have an equal probability of providing the minimum jitter value.

As shown in FIG. 3A, the jitter measuring points J1 through J4 of the first areas A1 through A4 are preferably at the center of gravity of the respective first areas A1 through A4. When at least one of the jitter measuring points is shifted from the center of gravity of the first area as shown in FIG. 6A, a search operation needs to be performed a larger number of times as compared to the case where all the jitter measuring points J1 through J4 are at the center of gravity of the respective first areas A1 through A4. This will be described below.

As shown in FIG. 6A, the jitter measuring points J1, J3 and J4 of the first areas A1, A3 and A4 are at the center gravity of the respective first areas A1, A3 and A4. A jitter measuring point JC0 of the first area A2 is shifted from the center of gravity G1 of the first area A2. When the jitter which is measured at the jitter measuring point JC0 shifted from the center of gravity G1 of the first area A2 has the minimum value among the jitter values measured at the jitter measuring points J1, J3, J4 and JC0, a first area 2500 is set as shown in FIG. 6B. The first area 2500 is square. Half of the length of a diagonal line of the first area 2500 is equal to the length of a line segment 2501 connecting the jitter measuring point J0 and the jitter measuring point JC0 The first area 2500 is further divided into four second areas C1, C2, C3 and C4 along lines 306 and 307 which cross each other perpendicularly at value 7 of the cut-off frequency FC and value 7 of the boost amount BST. Jitter measuring points JC1, JC2 and JC3 of the second areas C1, C2 and C3 are at the center of gravity of the respective second areas C1, C2 and C3. A jitter measuring point JC4 of the second area C4 is shifted from the center of gravity G2 of the second area C4.

Where the length of a diagonal line of the initial area 301 shown in FIG. 6A is 100%, the length of the line segment 2501 is 40%. Among the jitter measuring points JC1, JC2, JC3 and JC4, the initial area 301 includes only the jitter measuring point JC2. Since the jitter measuring points JC1, JC3 and JC4 are outside the initial area 301, a program which prevents measurement at the jitter measuring points JC1, JC3 and JC4 needs to be executed. As a result, the jitter is measured only at the jitter measuring points JC0 and JC2. When the position at which the jitter is minimum is located other than between the jitter measuring points JC0 and JC2, another first area needs to be set in order to search for the position at which the jitter is minimum.

As described above, when even at least one jitter measuring point is shifted from the center of gravity of the respective first area, a search operation needs to be performed a larger number of times as compared to the case where all the jitter measuring points J1 through, J4 are at the center of gravity of the respective first areas A1 through A4.

Another example in which one jitter measuring point is shifted from the center of gravity will be described.

It is assumed that the first area A2 has a jitter measuring point JCX which is shifted from the center of gravity G1 of the first area A2 toward the jitter measuring point J0 so that the length of a segment 2501 connecting the jitter measuring point J0 and the jitter measuring point JCX is 20% of the length of the diagonal line of the initial area 301. In this case, the first area 2500 is too small to cover the first area A2. Accordingly, when the point at which the jitter is minimum is located other than between the jitter measuring point J0 and the jitter measuring point JCX, another first area needs to be set in order to search for the position at which the jitter is minimum.

When the initial area 301 and the first areas A1 through A4 are preferably divided into four squares or rectangles since this simplifies a program for searching. The jitter shown in FIG. 4 changes continuously and never changes step-by-step. The reason is that the jitter generation probability distribution, which is generally considered as an index of the quality of a reproduction signal in an optical disk apparatus, is a normal distribution. The jitter contour 205D shown in FIG. 4 never becomes parallel to the axis of the cut-off frequency FC or the axis of the boost amount BST. The reason is that when the waveform equalization characteristics of the waveform equalizer (i.e., the cut-off frequency FC and the boost amount BST) change, the jitter also changes. In addition, there will never substantially be a plurality of positions at which the jitter is minimum in an initial area used to search for the position at which the jitter is minimum. Therefore, even when a position at which the jitter is minimum is located outside the initial area, a single position at which the jitter is minimum can be found within the initial area. Accordingly, unless the transfer characteristics of the signal system of the optical disk apparatus are significantly deteriorated, the position at which the jitter is minimum can be found within the initial area.

Figure 5:
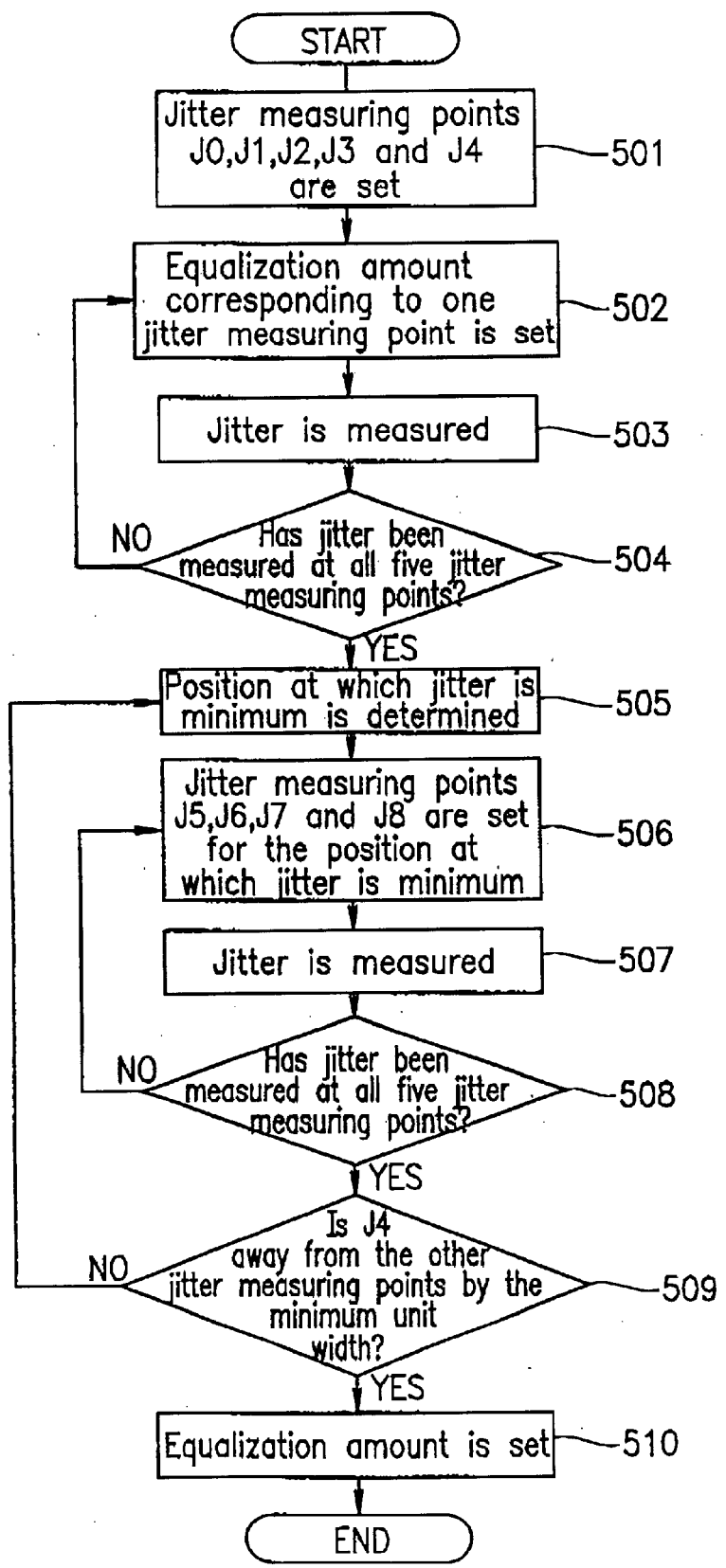
FIG. 5 is a flowchart illustrating a method for searching for an area where the jitter is minimum in the first example.

With reference to FIG. 5, the above-described method for searching for the minimum jitter value and the position at which the jitter is minimum will be described. In FIG. 5, searching for the minimum jitter value is performed in steps 501 through 504, and searching for the position at which the jitter is minimum is performed in steps 505 through 510.

The minimum jitter value searching section 6 for performing the method for searching for the minimum jitter value and the position at which the jitter is minimum can be implemented by firmware such as, for example, a digital signal processor (DSP) or a central processing unit (CPU).

In the initial step 301, five jitter measuring points J0, J1, J2, J3 and J4 are set (step 501). The equalization amount (i.e., the cut-off frequency FC and the boost amount BST) corresponding to either one of the jitter measuring points J0, J1, J2, J3 and J4 is set (step 502). Based on the set cut-off frequency FC and boost amount BST, the jitter is measured (step 503). It is determined whether or not the jitter has been measured at all five jitter measuring points J0, J1, J2, J3 and J4 (step 504). When it is determined that the jitter has not been measured at all five jitter measuring points J0, J1, J2, J3 and J4 (NO in step 504), the processing goes back to step 502 in order to measure the jitter at the jitter measuring point or points at which the jitter has not been measured. When it is determined that the jitter has been measured at all five jitter measuring points J0, J1, J2, J3 and J4 (YES in step 504), one of the five jitter measuring points J0, J1, J2, J3 and J4 at which the measured value of the jitter is minimum is determined (step 505). Hereinafter, explanation will be made with the example in which the jitter is minimum at the measuring point J4 among the five jitter measuring points J0, J1, J2, J3 and J4.

In the first area A4 corresponding to the jitter measuring point J4, four jitter measuring points J5, J6, J7 and J8 are set (step 506). The equalization amount (i.e., the cut-off frequency FC and the boost amount BST) corresponding to either one of the jitter measuring points J4, J5, J6, J7 and J8 is set, and based on the set cut-off frequency FC and boost amount BST, the jitter is measured (step 507). It is determined whether or not the jitter has been measured at all five jitter measuring points J4, J5, J6, J7 and J8 (step 508). When it is determined that the jitter has not been measured at all five jitter measuring points J4, J5, J6, J7 and J8 (NO in step 508), the processing goes back to step 506 in order to measure the jitter at the jitter measuring point or points at which the jitter has not been measured. When it is determined that the jitter has been measured at all five jitter measuring points J4, J5, J6, J7 and J8 (YES in step 508), it is determined whether or not the distance in the x direction and the y direction between the jitter measuring point J4 and each of the jitter measuring points J0, J1, J2 and J3 is 1, which is the minimum unit width (step 509). The "minimum unit width" refers to the minimum unit width of each of the cut-off frequency FC and the boost amount BST, which are two variables for varying the jitter. When it is determined that the distance in the x direction and the y direction between the jitter measuring point J4 and each of the jitter measuring points J0, J1, J2 and J3 is not the minimum unit width 1 (NO in step 509) the processing goes back to step 505. When it is determined that the distance in the x direction and the y direction between the jitter measuring point J4 and each of the jitter measuring points J0, J1, J2 and J3 is the minimum unit width 1 (YES in step 509), the jitter measuring point at which the measured jitter value is minimum is determined among is the jitter measuring points J4, J5, J6, J7 and J6, and the equalization amount (i.e., the cut-off frequency FC and the boost amount BST) corresponding to that jitter measuring point is set (step 510).

Hereinafter, a general algorithm used for executing the above-described method for setting the jitter measuring points by a DSP or the like will be described.

The variables are sequentially defined as follows.
1. The variable range for the cut-off frequency FC is defined as FCtotal, and the variable range for the boost amount is defined as BSTtotal.
2. A value of jitter on a plane defined by the cut-off frequency FC and the boost amount BST is defined as J.
3. The initial cut-off frequency FC is defined as $\alpha$, and the initial boost amount BST is defined as $\beta$.
4. The distance between two jitter measuring points with respect to the cut-off frequency FC in the initial area or the first area corresponding to the jitter measuring point at which the jitter is minimum is defined as $\Delta X$. The distance between two jitter measuring points with respect to the boost amount BST in the initial area or the first area corresponding to the jitter measuring point at which the jitter is minimum is defined as $\Delta Y$.
5. It is defined that the first area corresponding to the jitter measuring point at which the jitter is minimum is an r'th first area.

Where Fctotal and BSTtotal are expressed by:

$$(\alpha, \beta) = (FCtotal/2, BSTtotal/2) \quad (1),$$

and $$\Delta X = FCtotal/2^{(r+1)} \quad (2\text{-}1)$$

$$\Delta Y = BSTtotal/2^{(r+1)} \quad (2\text{-}2)$$

the jitter measuring points in the initial area are determined at the following five points:

$$Jc(\alpha+\Delta X, \beta+\Delta Y) \quad (4\text{-}1)$$

$$Jb(\alpha-\Delta X, \beta+\Delta Y) \quad (4\text{-}2)$$

$$Ja(\alpha, \beta) \quad (4\text{-}3)$$

$$Jd(\alpha+\Delta X, \beta-\Delta Y) \quad (4\text{-}4)$$

$$Je(\alpha-\Delta X, \beta-\Delta Y) \quad (4\text{-}5)$$

Then, the jitter measuring points in the r'th first area are determined at the following five points:

$$Jc'(\alpha'+\Delta X, \beta'+\Delta Y) \quad (5\text{-}1)$$

$$Jb'(\alpha'-\Delta X, \beta'+\Delta Y) \quad (5\text{-}2)$$

$$Ja'(\alpha', \beta') \quad (5\text{-}3)$$

$$Jd'(\alpha'+\Delta X, \beta'-\Delta Y) \quad (5\text{-}4)$$

$$Je'(\alpha'-\Delta X, \beta'-\Delta Y) \quad (5\text{-}5)$$

Here, $\alpha'$ and $\beta'$ are sequentially updated to be the jitter measuring point at which the measured jitter value is minimum among the five jitter measuring points.

$\Delta X$ and $\Delta Y$ also vary in accordance with the value of "r", which represents the number of times the initial area is divided. In the formulas (5-1) through (5-5), the cut-off frequency FC and the boost amount BST which correspond to the jitter measuring point at which the jitter is minimum are set.

When the above algorithm is executed by a DSP or other firmware, a single calculation module can be used repeatedly. Therefore, the equalization amount (i.e., the cut-off frequency FC and the boost amount BST) can be set with less resources (program capacity or work area).

In the case where there is an area where the jitter cannot be measured due to improper control of the PLL or improper servo control, the minimum jitter value is searched for with the measurements in the area being excluded. Thus, the optimum combination of the cut-of frequency FC and the boost amount BST can be quickly determined.

Hereinafter, a structure and method for effectively using the basic module will be described with reference to FIG. 7.

FIG. 7 illustrates the order of measuring the jitter at the jitter measuring points by the minimum jitter value searching method in the first example.

As shown in FIG. 7, an initial area 601 includes five first areas 602, 603, 604, 605 and 606. First, the jitter is measured in the first area 602, and then jitter is measured in the order of the first areas 603, 604, 605 and 606. When each first area is further divided, the each first area is divided into second areas having the same positional relationship as that of the 602, 603, 604, 605 and 606, and the jitter is measured in a corresponding order. It is preferable to set the order of the first areas in which the jitter is measured since, in this way, a single calculation module can be used repeatedly and thus processing of μ code or firmware is simplified.

In the above-described minimum jitter value searching method, it is ideal to precisely search for the minimum jitter value by repeating the area division up to the limit of the resolution of the cut-off frequency FC and the boost amount BST of the waveform equalizer. However, when the jitter detection sensitivity is lower than the resolution of the cut-off frequency FC and the boost amount BST of the waveform equalizer, such a method is time-consuming consuming and thus is not preferable. The algorithm can be shortened by terminating the minimum jitter value search in the case where the measured jitter value is equal to or lower than a prescribed set value JH when jitter is measured at all of five jitter measuring points.

Figure 8:
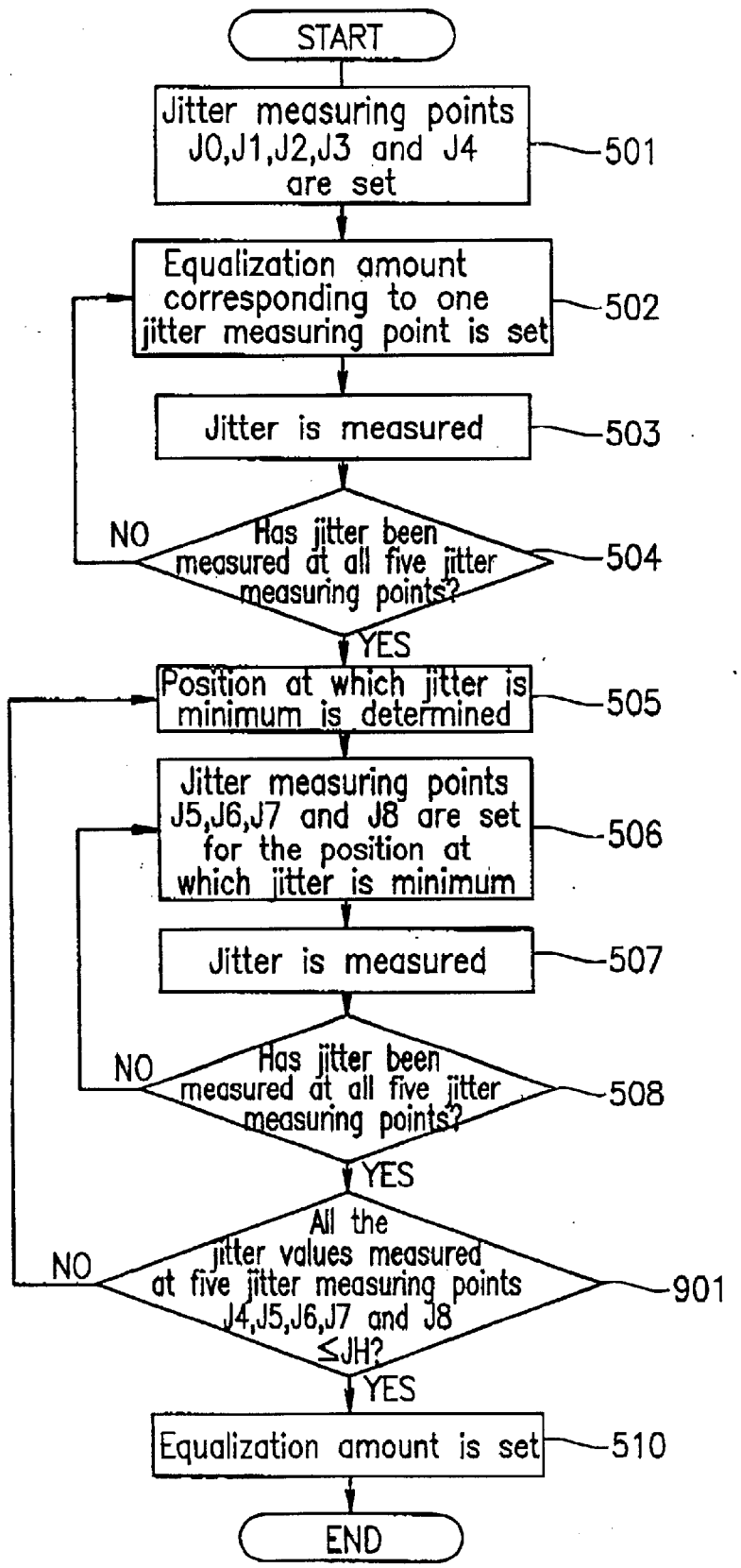
FIG. 8 is a flowchart illustrating another method for searching for an area where the jitter is minimum in the first example.

FIG. 8 is a flowchart illustrating this minimum jitter value method. Identical steps previously discussed with respect to FIG. 5 bear identical reference numerals and the detailed descriptions thereof will be omitted.

The method in FIG. 8 is different from the method in FIG. 5 in that in step 901, it is determined whether or not all of the jitter values measured at the five jitter measuring points J4, J5, J6, J7 and J8 are equal to or less than the prescribed set value JH, which represents the jitter detection sensitivity. When it is determined that all of the jitter values measured at the five jitter measuring points J4, J5, J6, J7 and J8 are not equal to or less than the prescribed set value JH (NO in step 901), the processing goes back to step 505. When it is determined that all of the jitter values measured at the five jitter measuring points J4, J5, J6, J7 and J8 are equal to or less than the prescribed set value JH (YES in step 901), the jitter measuring point at which the measured jitter value is minimum is determined among the jitter measuring points J4, J5, J6, J7 and J8, and the equalization amount (i.e., the cut-off frequency FC and the boost amount BST) corresponding to that jitter measuring point are set (step 510).

The prescribed set value JH can be set based on the above-described jitter detection sensitivity.

By terminating the minimum jitter value search under a specific condition, the time period required for the search can be shortened.

Figure 9:
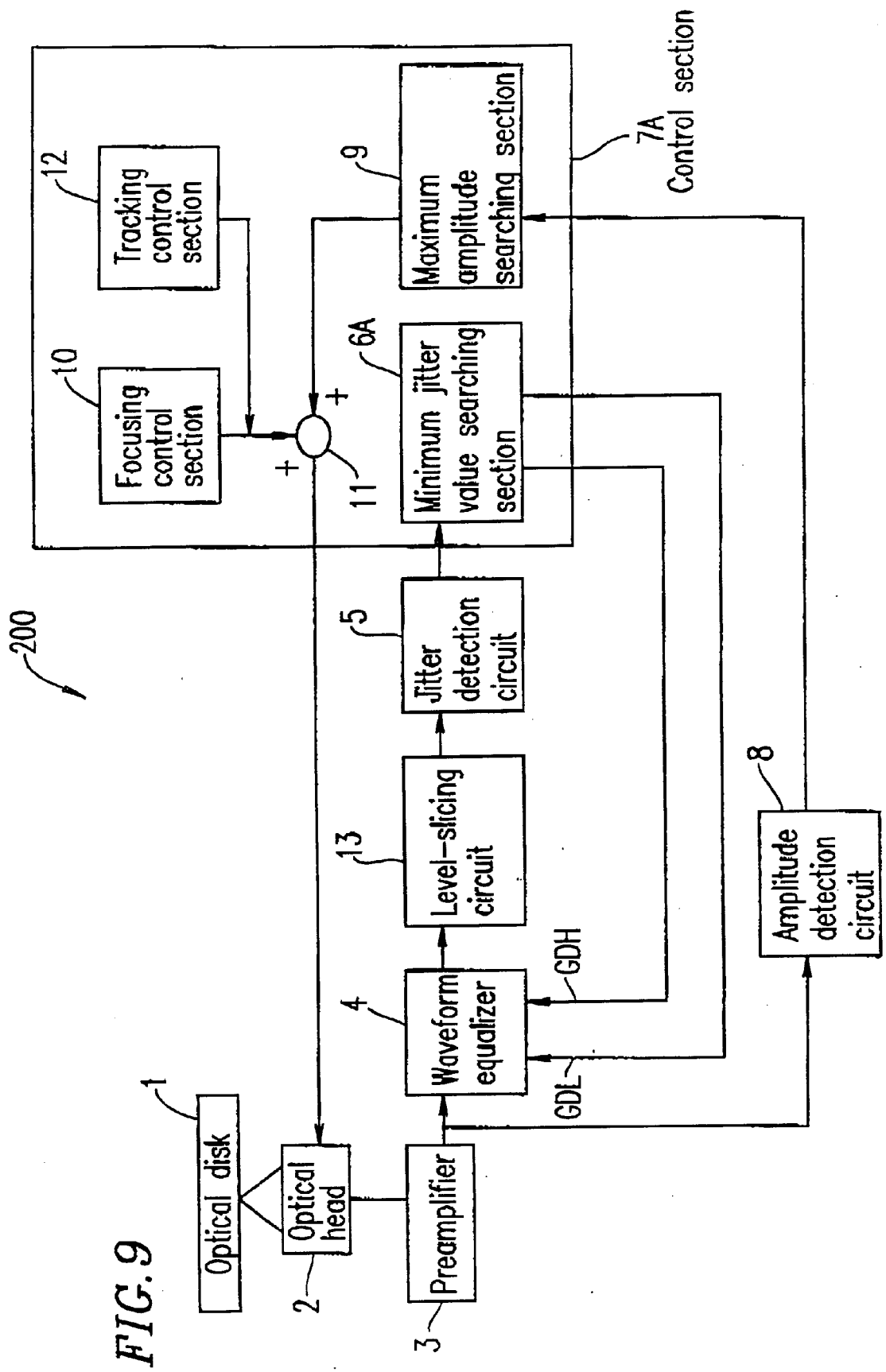
FIG. 9 is a block diagram illustrating another optical disk apparatus in the first example.

FIG. 9 is a block diagram illustrating a structure of another optical disk apparatus 200 according to the first example of the present invention. Identical elements previously discussed with respect to FIG. 1 bear identical reference numerals and the detailed descriptions thereof will be omitted. The optical disk apparatus 200 includes a minimum jitter value searching section 6A instead of the minimum jitter value searching section 6 in FIG. 1.

The minimum jitter value searching section 6A performs another method for determining the optimum combination of two variables x and y at which the jitter is minimum. In this method, variable x represents a group delay amount in a high frequency range of the waveform equalizer 4, and variable y represents a group delay amount in a low frequency range of the waveform equalizer 4.

In order to describe a minimum jitter value searching method performed by the minimum jitter value searching section 6A, the relationship between the group delay amount and the jitter will be described.

A group delay amount (unit:time), which is defined by a change in the phase with respect to the frequency when waveform equalization is performed, includes a low range delay amount GDL corresponding to a relatively low range of the frequency band of a signal to be waveform-equalized and a high range group delay amount GDH corresponding to a relatively high range of the frequency band of the signal to be waveform-equalized. The low range group delay amount GDL and the high range group delay amount GDH are set to be variable. When the waveform equalizer is formed of a multi-stage filter, the delay characteristic represented by the group delay amount can be determined by setting the characteristic of any of the filters to be variable so as to obtain a desirable characteristic. When waveform equalizer is formed of a FIR (findite impulse response) filter, the group delay characteristic can be determined by setting each tap coefficient to be variable.

Figure 10:
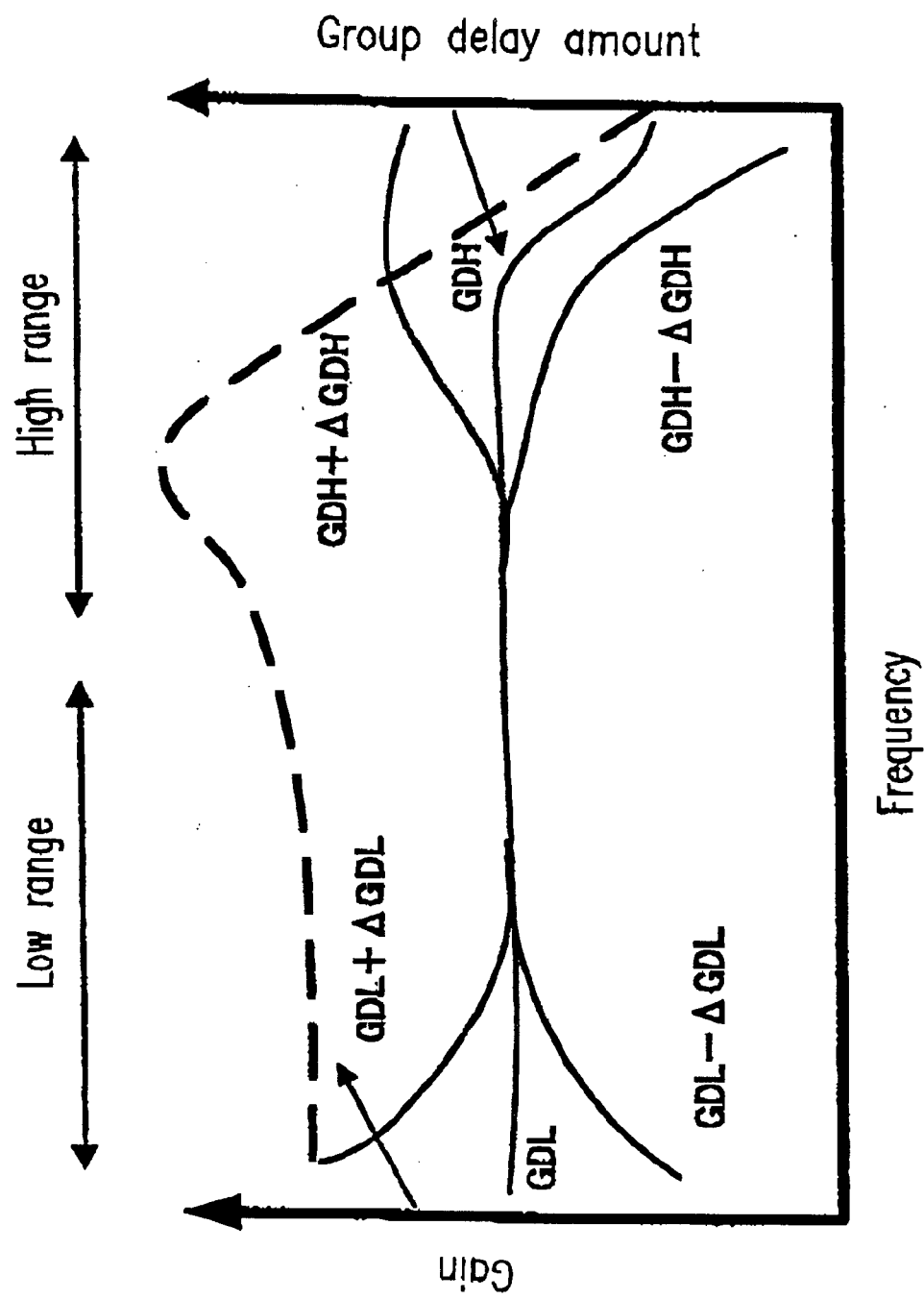
FIG. 10 is a graph illustrating the group delay amount characteristic of a waveform equalizer used in the first example.

FIG. 10 shows the group delay characteristic of the waveform equalizer 4. The horizontal axis represents the frequency, the left vertical axis represents the gain and the right vertical axis represents the group delay amount. In an ideal transfer path, the group delay amount when waveform equalization is performed is flat in all the frequency bands. When the transfer path (including a circuit and a circuit element) includes an element which distorts the group delay characteristic, a higher quality signal can be obtained by varying the group delay amount. In actuality, any transfer path includes distortion in the delay characteristic, and deterioration in the quality of a reproduction signal caused by the distortion appears in the jitter. Accordingly, the high range group delay amount GDH and the low range group delay amount GDL each have an optimum delay amount. The optimum combination of the high range group delay amount GDH and the low range group delay amount GDL can be determined according to the present invention.

FIG. 11 is a graph illustrating the relationship between the low range group delay amount, the high range group delay amount and the jitter. A jitter contour 205E is obtained by connecting points of identical jitter when the high range group delay amount GDH and the low range group delay amount GDL are varied, as in the case where the cut-off frequency FC and the boost amount BST are used (FIGS. 2A through 2C and 4).

The combination of the high range group delay amount GDH and the low range group delay amount GDL which realize an optimum delay characteristic can be set in the waveform equalizer 4 by obtaining the position at which the jitter is minimum in a plane having the high range group delay amount GDH as the horizontal axis and the low range group delay amount GDL as the vertical axis.

Figure 12:
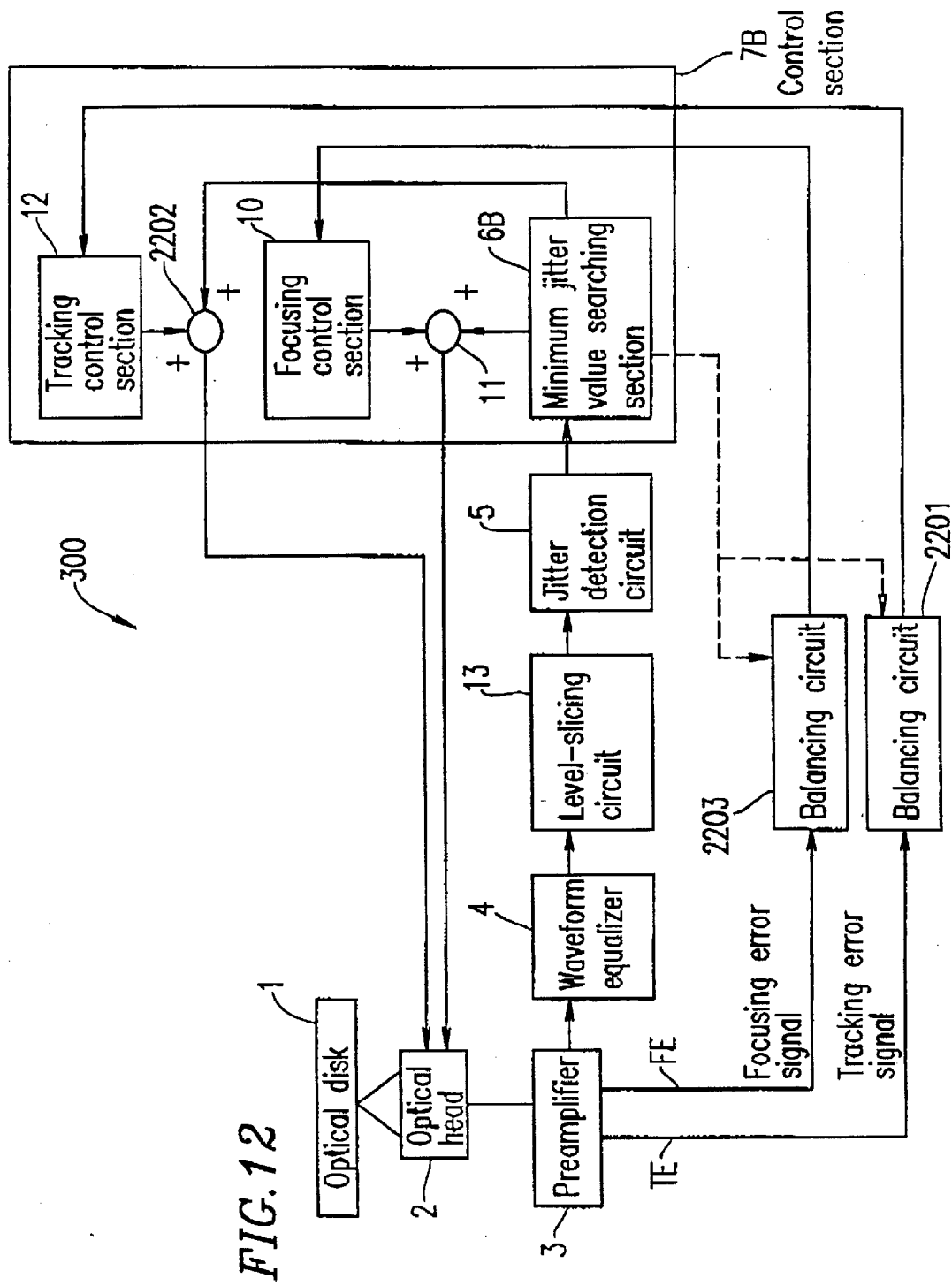
FIG. 12 is a block diagram illustrating still another optical disk apparatus in the first example.

FIG. 12 is a block diagram illustrating a structure, of still another optical disk apparatus 300 according to the first example of the present invention. Identical elements previously discussed with respect to FIG. 1 bear identical reference numerals and the detailed descriptions thereof will be omitted. The optical disk apparatus 300 includes balancing circuits 2201 and 2203 instead of the amplitude detection circuit 8 (FIG. 1) and includes a control section 7B instead of the control section 7 (FIG. 1). The control section 7B includes a tracking control section 12, a focusing control section 10, the minimum jitter value searching section 6B, and a synthesis circuit 2202.

The optical disk apparatus 300 also finds the optimum combination of variables x and y at which the jitter is minimum. Variable x represents a target position of the tracking control section 12 for controlling the optical head 2 so that the optical beam correctly cans the track on the optical disk 1 (such a target position will be referred to as the "tracking position"), and variable y represents a target position of the focusing control section 10 for controlling the optical head 2 so that the optical beam directed to the optical disk 1 is in a prescribed state (such a target position will be referred to as the "focusing position"). Hereinafter, a structure and method for finding the optimum combination of the focusing position and the tracking position will be described.

The control section 7B receives a focusing error signal FE which is generated by the preamplifier 3 and A/D-converted by the balancing circuit 2203. The control section 7B also receives a tracking error signal TE which is generated by the preamplifier 3 and A/D-converted by the balancing circuit 2201.

The focusing error signal FE is then phase-compensated and gain-compensated by a digital filter (not shown) included in the focusing control section 10 and D/A-converted by a D/A converter (not shown). The resultant signal is output to a focusing driving section (not shown) included in the optical head 2.

The tracking error signal TE is then phase-compensated and gain-compensated by a digital filter (not shown) included in the tracking control section 12 and D/A-converted by the D/A converter. The resultant signal is output to a tracking driving section (not shown) included in the optical head 2.

An offset which is to be sent to the synthesis circuit 11 for receiving an output from the focusing control section 10 and an offset which is to be sent to the synthesis circuit 2202 for receiving an output from the tracking control section 12 are searched for by the minimum jitter value searching section 6B, so that the jitter input from the jitter detection section 5 is minimum. In other words, values to be set as the focusing position and the tracking position are searched for by the minimum jitter value searching section 6B.

FIG. 13 is a graph illustrating the relationship between the focusing position, the tracking position, and the jitter. A jitter contour 205F is obtained by connecting points of identical jitter when the tracking position and the focusing position are varied as in the case where the cut-off frequency FC and the boost amount BST are used (FIGS. 2A through 2C and 4).

The optimum combination of the tracking position and the focusing position can be set in the waveform equalizer 4 by obtaining the position at which the jitter is minimum in a plane having the tracking position as the horizontal axis and the focusing position as the vertical axis.

In the above description, the structure for varying the focusing position and the tracking position is realized by applying a digital offset to a signal from the focusing control section 10 in the control section 7B and to a signal from the tracking control section 12 also in the control section 7B. Alternatively, a similar structure can be realized by varying an output from the balancing circuit 2203 for receiving the focusing error signal FE and an output from the balancing circuit 2201 for receiving the tracking error signal TE as shown by the dashed line in FIG. 12.

Figure 14:
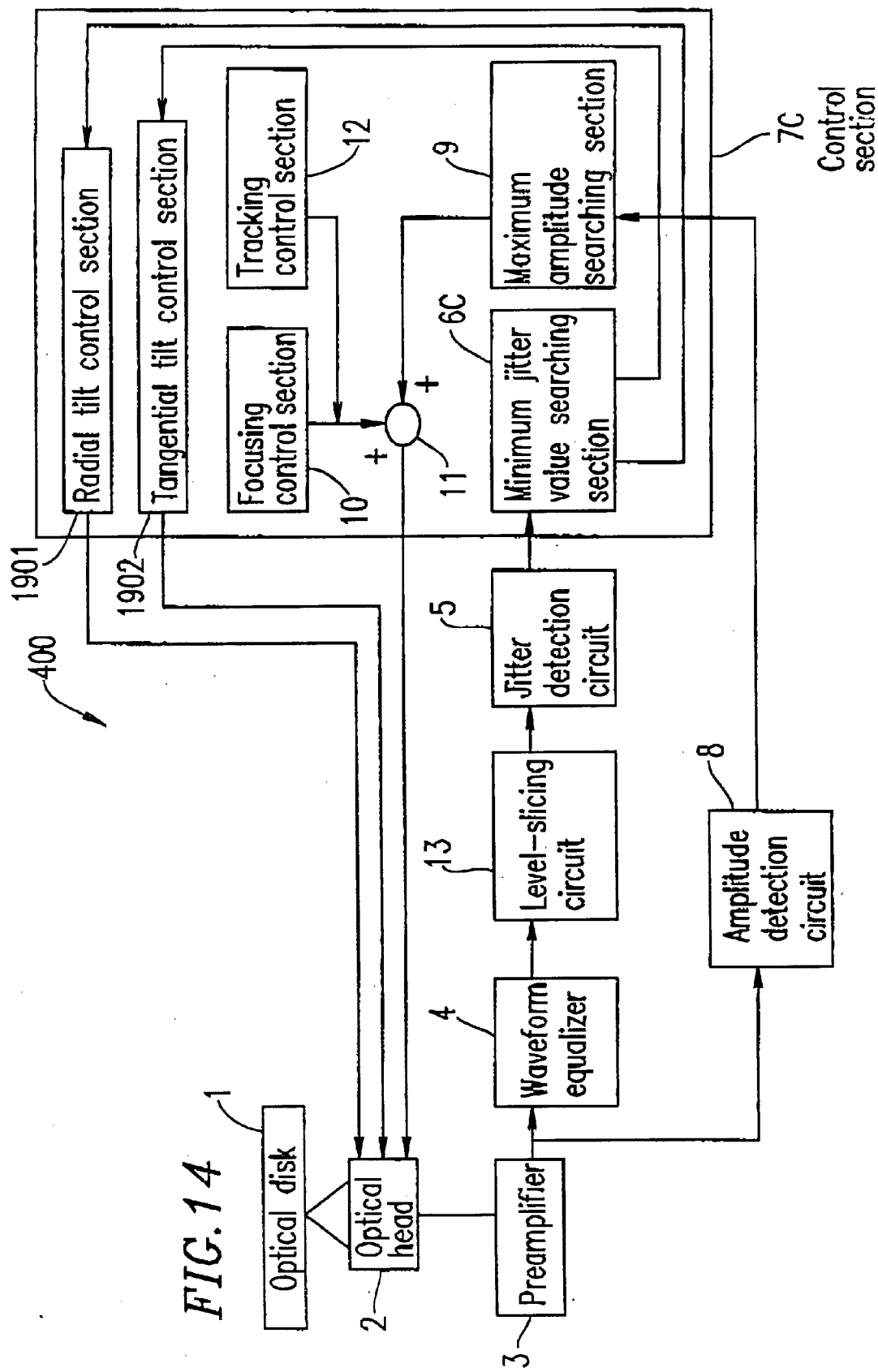
FIG. 14 is a block diagram illustrating still another optical disk apparatus in the first example.

FIG. 14 is a block diagram illustrating a structure of still another optical disk apparatus 400 according to the first example of the present invention. Identical elements previously discussed with respect to FIG. 1 bear identical reference numerals and the detailed descriptions thereof will be omitted. The optical disk apparatus 400 includes a control section 7C instead of the control section 7 (FIG. 1). The control section 7C includes a radial tilt control section 1901, a tangential tilt control section 1902, a focusing control section 10, a tracking control section 12, a synthesis section 11, a minimum jitter value searching section 6C and a maximum amplitude searching section 9.

The optical disk apparatus 400 also finds the optimum combination of variables x and y at which the jitter is minimum. Variable x represents a radial tilt in a radial direction of the optical disk 1, and variable y represents a tangential tilt in a tangential direction of the optical disk 1. The radial tilt and the tangential tilt are correctable. Hereinafter, a structure and method for finding the optimum combination of the corrected value (adjusted value) of the radial tilt and the corrected value (adjusted value) of the tangential tilt will be described.

Figure 15:
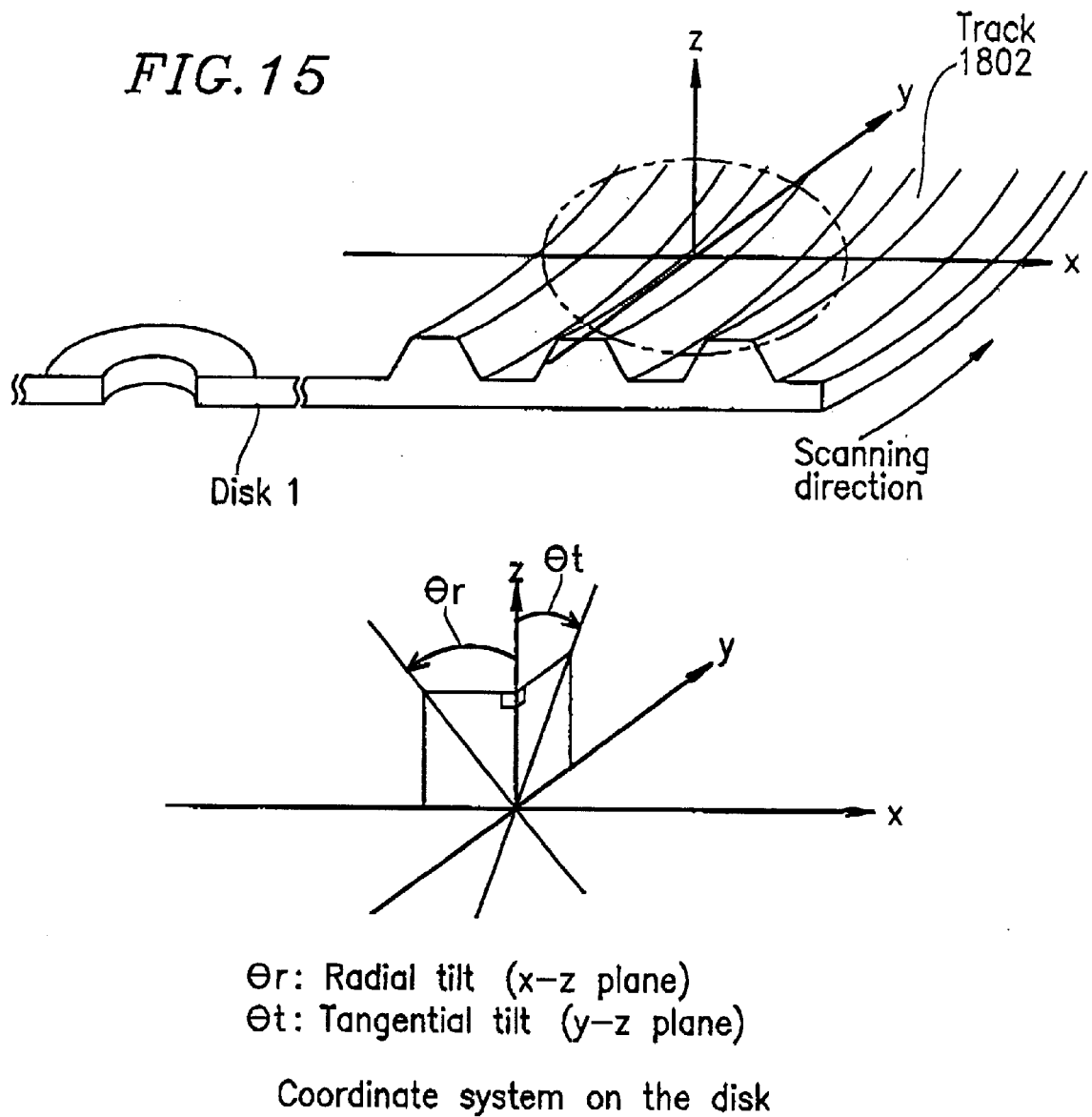
FIG. 15 is a schematic view illustrating the coordinate system indicating the radial tilt and the tangential tilt in the first example.

FIG. 15 is a schematic view for illustrating a tilt coordinate system used in the first example. FIG. 15 shows the optical disk 1, a track 1802 on the optical disk 1, and a coordinate system indicating the radial tilt and the tangential tilt. The x axis represents a radial direction of the optical disk 1, the y axis represents a direction in which an optical beam scans the track 1802 on the optical the track 1, and the z axis represents a direction vertical to the surface of the optical disk 1. It is assumed that the optical beam is directed to the optical disk 1 along the z axis. As shown in FIG. 15, the tilt of the optical beam axis with respect to the x-z plane is defined as a radial tilt $\theta r$. The tilt of the optical beam axis with respect to the y-z plane is defined as a tangential tilt $\theta t$.

The radial tilt $\theta r$ and the tangential tilt $\theta t$ can be varied by providing the radial tilt control section 1901 and the tangential tilt control section 1902 in the control section 7C (FIG. 14). Specifically, the radial tilt $\theta r$ and the tangential tilt $\theta t$ can be varied by mechanically tilting the optical head 2 or optically varying the optical path. The specific method for varying the radial tilt $\theta r$ and the tangential tilt $\theta t$ is not limited to these. When one or both of the radial tilt $\theta r$ and the tangential tilt $\theta t$ vary, the distribution of the optical beam on the optical disk 1 is distorted, and thus the jitter is increased. The radial tilt $\theta r$ and the tangential tilt $\theta t$ each has an optimum tilt amount. The optimum combination of the radial tilt $\theta r$ and the tangential tilt $\theta t$ can be determined according to the present invention.

FIG. 16 is a graph illustrating the relationship between the radial tilt, the tangential tilt, and the jitter. A jitter contour 205G is obtained by connecting points of identical jitter when the radial tilt and the tangential tilt are varied as in the case where the cut-off frequency FC and the boost amount BST are used (FIGS. 2A through 2C and 4).

The optimum combination of the radial tilt $\theta r$ and the tangential tilt $\theta t$ can be set in the waveform equalizer 4 by obtaining the position at which the jitter is minimum in a plane having the tracking position as the horizontal axis and the focusing position as the vertical axis. In general, tilt correction is actually performed using a liquid crystal device or tilt actuator. The present invention is not limited to any specific structure for correcting the tilt.

EXAMPLE 2

Figure 17:
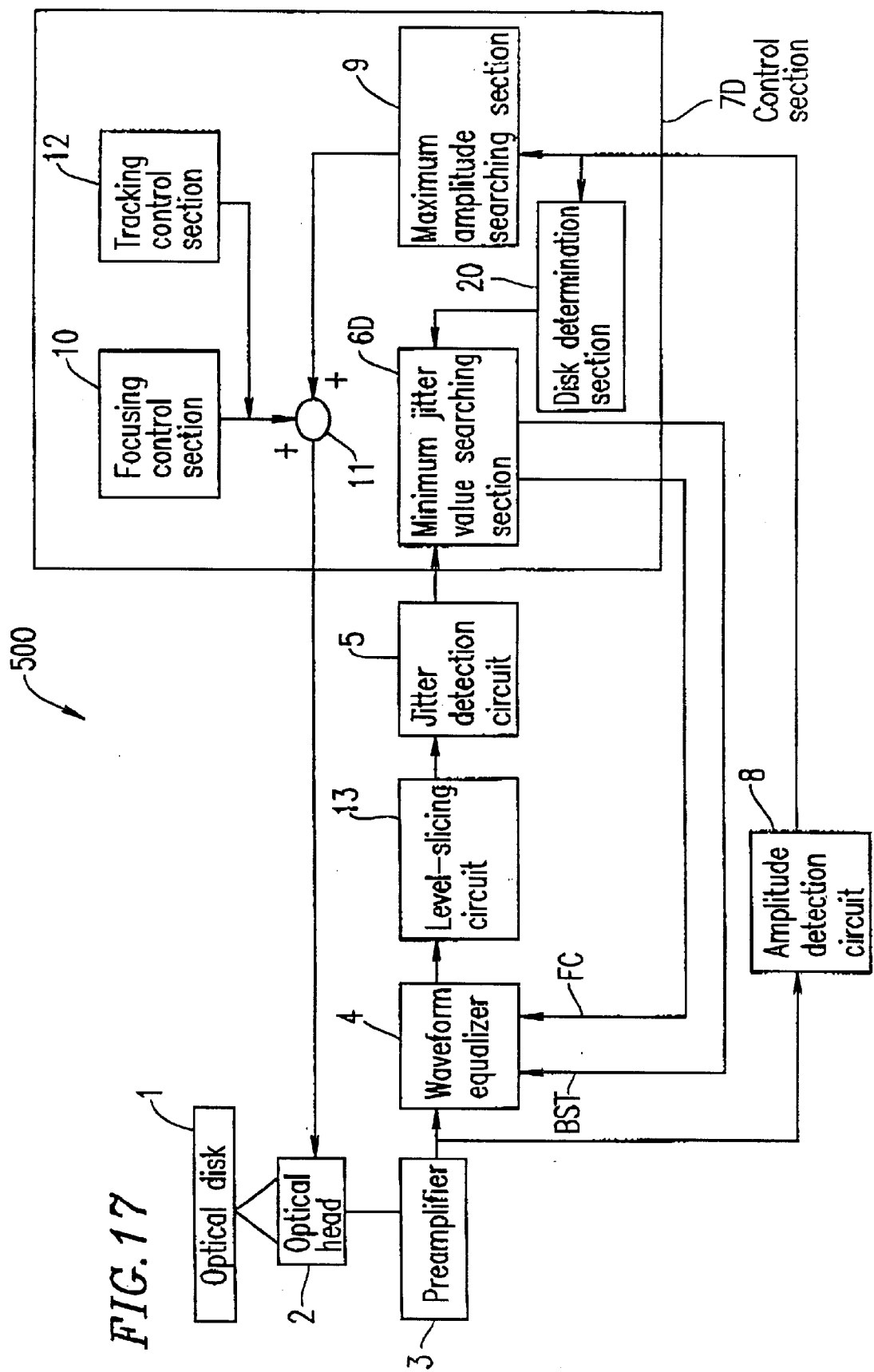
FIG. 17 is a block diagram illustrating an optical disk apparatus in a second first example according to the present invention.

FIG. 17 is a block diagram illustrating a structure of an optical disk apparatus 500 according to a second example of the present invention for reproducing various types of disks. Identical elements previously discussed with respect to FIG. 1 bear identical reference numerals and the detailed descriptions thereof will be omitted.

The optical disk apparatus 500 generally performs as follows. An x-y plane, defined by variables x and y, as an initial area is divided into a plurality of first areas having an identical rectangular shape. Based on the type of disk mounted on the optical disk apparatus 500, one of the plurality of first areas is selected. The selected first area is further divided into a plurality of second areas, each of which has a respective jitter measuring point at the center of gravity thereof. One of the plurality of second areas which has the jitter measuring point at which a minimum jitter is measured among the plurality of jitter measuring points is determined. This procedure can be repeated appropriately. Then, the optimum combination of variable x and variable y which correspond to the area which has been determined to have the minimum jitter is determined. Thus, an optimum characteristic of the waveform equalizer for each type of disk is determined.

Variables x and y can vary the jitter. In this example, variable x represents the cut-off frequency FC, and variable y represents the boost amount BST.

As shown in FIG. 17, the optical disk apparatus 500 includes an optical head 2 for directing an optical beam generated by a light source, such as, for example, a semiconductor laser to an optical disk 1 as an information carrier in a converged state, a preamplifier 3 for amplifying a reproduction signal corresponding to light reflected by the optical disk 1 and output by the optical head 2, a waveform equalizer 4 for waveform-equalizing the reproduction signal amplified by the preamplifier 3, a level-slicing circuit 13 for level-slicing the reproduction signal waveform-equalized by the waveform equalizer 4, a jitter detection circuit 5 for detecting the jitter of the reproduction signal which has been level-sliced by the level-slicing circuit 13, an amplitude detection circuit 8 for detecting the amplitude of the reproduction signal amplified by the preamplifier 3, and a control section 7D for controlling the optical head 2 so that the optical beam directed from the optical head 2 to the optical disk 1 is in an optimum converged state.

The control section 7D includes a minimum jitter value searching section 6D for searching for the minimum value of the jitter detected by the jitter detection circuit 5, a maximum amplitude searching section 9 for searching for a focusing position at which the amplitude of the reproduction signal detected by the amplitude detection circuit 8 is maximum, a focusing control section 10 for executing focusing control so that the optical beam from the optical head 2 is in an optimum converged state on the optical disk 1, a tracking control section 12 for executing tracking control so that the optical beam from the optical head 2 correctly scans the track on the optical disk 1, and a synthesis circuit 11 for synthesizing a signal from the maximum amplitude searching section 9 with a focusing control signal from the focusing control section 10 and a tracking control signal from the tracking control section 12. The control section 7D further includes a disk determination section 20.

The disk determination section 20 measures an amplitude of a signal which corresponds to an optical beam reflected by the optical disk 1, the amplitude being measured by the amplitude detection circuit 8, i.e., an RF signal amplitude, and compares the RF signal amplitude with a prescribed determination level. Thus, the disk determination section 20 determines the type of optical disk 1 mounted on the optical disk apparatus 500 and switches the processing performed by the minimum jitter value searching section 6D accordingly.

The optical disk apparatus 500 is usable to reproduce at least two different types of optical disks 1 which are different in reflectance, density, or capacity. The optical disk apparatus 500 is not limited to any specific type of optical disk to be reproduced. For the sake of simplicity, it is assumed that the optical disk apparatus 500 is usable to reproduce the types of disks shown in Table 1.

TABLE 1

| Disk α | Reflectance 80% | Channel clock 4 MHz |
| Disk β | Reflectance 40% | Channel clock 27 MHz |
| Disk γ | Reflectance 20% | Channel clock 29 MHz |

Figure 18:
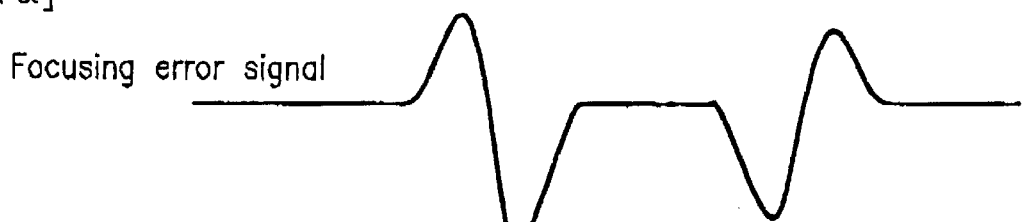
FIG. 18 is a waveform diagram illustrating an operation of a disk determination section of the optical disk apparatus in the second example.

FIG. 18 shows the waveforms of the focusing error signal and the RF signal of the disks α, β and γ.

The optical head 2 is moved closer to or away from the optical disk 1 in accordance with the reflectance of the optical disk 1 mounted on the optical disk apparatus 500 before the focusing control section 10 is operated. When the optical beam spot is focused on the optical disk 1, a focusing error signal and an RF signal are output. FIG. 18 shows the waveforms of the focusing error signal and the RF signal obtained with each of the disks α, β and γ.

The amplitude detection circuit 8 processes the amplitude of the RF signal by envelope detection or the like, and inputs the resulting RF amplitude to the control section 7D after A/D-converting the result by an A/D converter (not shown). The disk determination section 20 in the control section 7D compares the RF amplitude with a prescribed level so as to determine whether the optical disk mounted on the optical disk apparatus 500 is disk α, disk β or disk γ. The determination result is input to the minimum jitter value searching section 6D, which switches the searching algorithm in accordance with the determination result.

Hereinafter, a determination algorithm for switching the search algorithm based on the determination result will be described with reference to FIGS. 19A, 19B and 19C.

FIGS. 19A, 19B and 19C each show an initial area A. FIG. 19A shows the initial area A which is used when disk α is mounted. FIG. 19B shows the initial area A which is used when disk β is mounted. FIG. 19C shows the initial area A which is used when disk γ is mounted. The initial area A is divided into a plurality of (four in this example) first areas having an identical rectangular shape. Based on the type of disk detected by the disk determination section 20, one of the first areas is selected.

When the optical disk mounted on the optical disk apparatus 500 is determined to be disk α by the disk determination section 20, the optical disk apparatus 500 operates as follows. Disk α has a reproduction rate of 4 MHz, which is the lowest among the reproduction rates of the three types of disks. Accordingly, an shown in FIG. 19A, a first area Z, which is a quarter of the initial area A having the lowest cut-off frequency FC, is selected from the four first areas and divided into second areas Z1, Z2, Z3 and Z4. The second areas Z1, Z2, Z3 and Z4 have boost amounts BST which are incremented by two. The jitter measuring points J1, J2, J3 and J4 are determined for the second areas Z1, Z2, Z3 and Z4, respectively. Then, the jitter is measured at the four jitter measuring points J1, J2, J3 and J4, and the second area having the smallest jitter is determined among the four second areas Z1, Z2, Z3 and Z4. When the jitter is equal at the four measuring points J1, J2, J3 and J4, the second area having the smallest jitter cannot be determined.

In such a case, the jitter is also measured at the jitter measuring point J0, which is at the center of the four second areas Z1, Z2, Z3 and Z4. When the jitter is equal at all five jitter measuring points J0, J1, J2, J3 and J4, the values of the cut-off frequency FC and the boost amount BST at the jitter measuring point J0 are determined as the optimum values.

The jitter in the area Z is shown by the jitter contour 205D shown in FIG. 4. According to the jitter characteristic shown by the jitter contour 205D, the jitter is minimum at the jitter measuring point J3 among the jitter measuring points J1, J2, J3 and J4. The optimization of the frequency characteristic of the waveform equalizer 4 when disk α is mounted on the optical disk apparatus 500 is performed by setting the cut-off frequency FC and the boost amount BST corresponding to the jitter measuring point J3.

When the optical disk mounted on the optical disk apparatus 500 is determined to be disk β by the disk determination section 20, the optical disk apparatus 500 operates as follows. Disk β has a reproduction rate of 27 MHz, which is the second highest among the reproduction rates of the three types of disks. Accordingly, as shown in FIG. 19B, a first area Y, which is a quarter of the initial area A having a cut-off frequency FC of a value slightly higher than the middle value, is selected from the four first areas and divided into second areas Y1, Y2, Y3 and Y4. The second areas Y1, Y2, Y3 and Y4 have boost amounts BST which are incremented by two. The jitter measuring points J1, J2, J3 and J4 are determined for the second areas Y1, Y2, Y3 and Y4, respectively. Then, the jitter is measured at the four jitter measuring points J1, J2, J3 and J4, and the second area having the smallest jitter is determined among the four second areas Y1, Y2, Y3 and Y4. When the jitter is equal at the four measuring points J1, J2, J3 and J4, the second area having the smallest jitter cannot be determined.

In such a case, the jitter is also measured at the jitter measuring point J0, which is at the center of the four second areas Y1, Y2, Y3 and Y4. When the jitter is equal at all five jitter measuring points J0, J1, J2, J3 and J4, the values of the cut-off frequency FC and the boost amount BST at the jitter measuring point J0 are determined as the optimum values.

In the case where, for example, the jitter is minimum at the jitter measuring point J3 among the five jitter measuring points J0, J1, J3, J3 and J4, the optimization of the frequency characteristic of the waveform equalizer 4 when disk β is mounted on the optical disk apparatus 500 is performed by setting the cut-off frequency FC and the boost amount BST corresponding to the jitter measuring point J3.

When the optical disk mounted on the optical disk apparatus 500 is determined to be disk γ by the disk determination section 20, the optical disk apparatus 500 operates as follows. Disk γ has a reproduction rate of 29 MHz, which is the highest among the reproduction rates of the three types of disks. Accordingly, a first area X, which is a quarter of the initial area A having the highest cut-off frequency FC, is selected from the four first areas and divided into second areas X1, X2, X3 and X4. The second areas X1, X2, X3 and X4 have boost amounts BST which are incremented by two. The jitter measuring points J3, J2, J3 and J4 are determined for the second areas X1, X2, X3 and X4, respectively. Then, the jitter is measured at the four jitter measuring points J1, J2, J3 and J4, and the second area having the smallest jitter is determined among the four second areas X1, X2, X3 and X4. When the jitter is equal at the four measuring points J1, J2, J3 and J4, the second area having the smallest jitter cannot be determined.

In such a case, the jitter is also measured at the jitter measuring point J0, which is at the center of the four second areas X1, X2, X3 and X4. When the jitter is equal at all five jitter measuring points J0, J1, J2, J3 and J4, the values of the cut-off frequency FC and the boost amount BST at the jitter measuring point J0 are determined as the optimum values.

In the case where, for example, the jitter is minimum at the jitter measuring point J2 among the five jitter measuring points J0, J1, J2, J3 and J4, the optimization of the frequency characteristic of the waveform equalizer 4 when disk γ is mounted on the optical disk apparatus 500 is performed by setting the cut-off frequency FC and the boost amount BST corresponding to the jitter measuring point J2.

Figure 20:
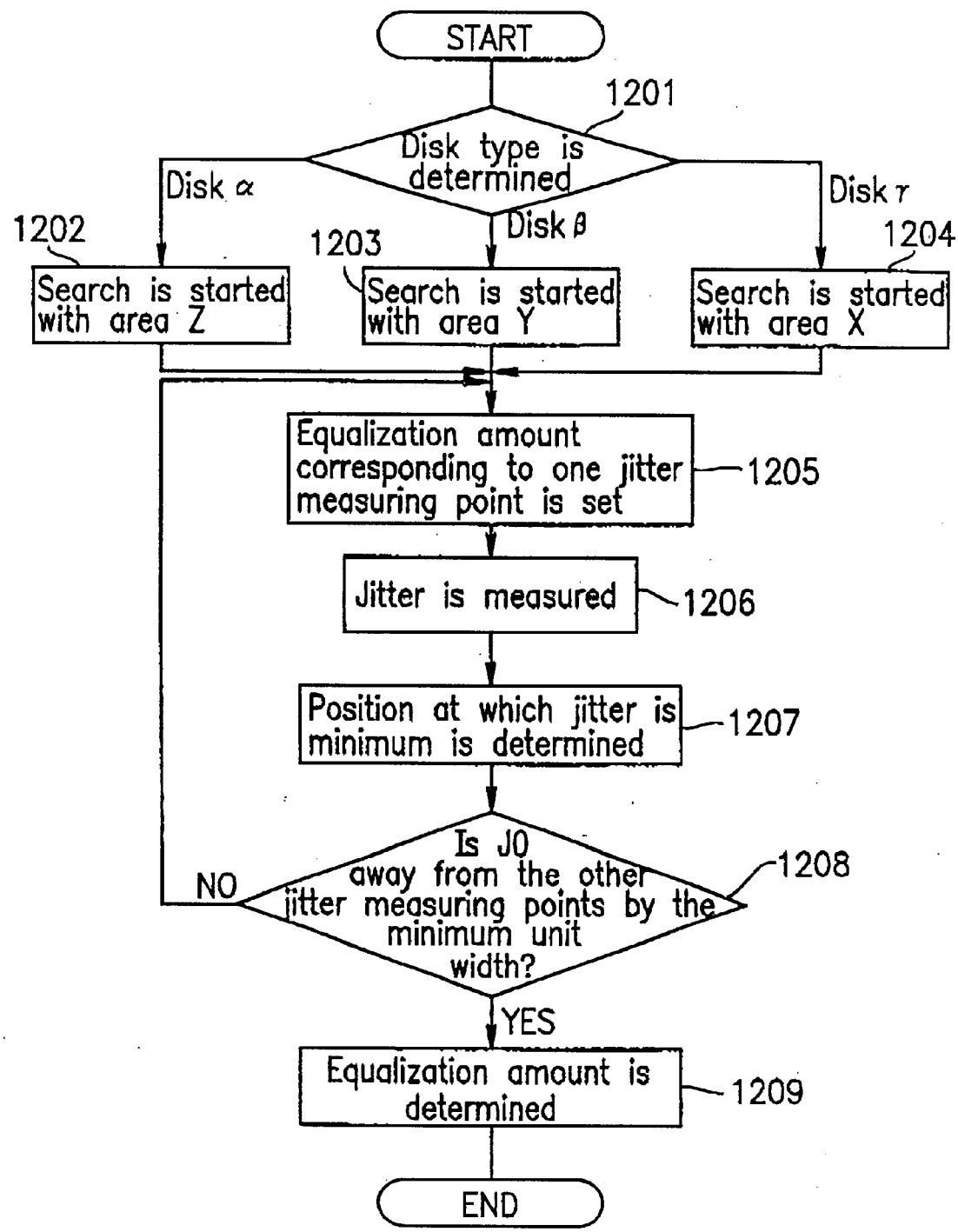
FIG. 20 is a flowchart illustrating a method for searching for an area where the jitter is minimum in the second example.

With reference to FIG. 20, the processing performed by the control section 7D for optimizing the frequency characteristic of the waveform equalizer 4 will be described.

The disk determination section 20 determines the type of the disk mounted on the optical disk apparatus 500 (step 1201). When the disk is determined as disk α, a first area Z, which is a quarter of the initial area A having the lowest cut-off frequency FC, is selected and divided into second areas Z1, Z2, Z3 and Z4 having boost amounts BST which are incremented by two (step 1202). When the disk is determined as disk α, a first area Y, which is a quarter of the initial area A having a cut-off frequency FC of a value slightly higher than the middle value, is selected and divided into second areas Y1, Y2, Y3 and Y4 having boost amounts BST which are incremented by two (step 1203). When the disk is determined as disk γ, a first area X, which is a quarter of the initial area A having the highest cut-off frequency FC, is selected and divided into second areas X1, X2, X3 and X4 having boost amounts BST which are incremented by two (step 1204).

The jitter measuring points respectively in the four second areas are determined, and an equalization amount (i.e., the cut-off frequency FC and the boost amount BST) is set (step 1205). The jitter is measured at the five jitter measuring points J0, J1, J2, J3 and J4 (step 1206). The jitter measuring point at which the jitter is minimum is determined among the five jitter measuring points (step 1207).

It is determined whether or not the distance in the x direction and the y direction between the jitter measuring point J0 and each of the jitter measuring points J2 and J3 is 1, which is the minimum unit width (step 1208). When it is determined that the distance in the x direction and the y direction between the jitter measuring point J0 and each of the jitter measuring points J2 and J3 is not the minimum unit width (NO in step 1208), the processing goes back to step 1205. When it is determined that the distance in the x direction and the y direction between the jitter measuring point J0 and each of the jitter measuring points J2 and J3 is the minimum unit width (YES in step 1208), the jitter measuring point at which the measured jitter value is minimum among the five jitter measuring points is determined, and the equalization amount (i.e., the cut-off frequency FC and the boost amount BST) corresponding to that jitter measuring point is set. (step 1209).

As described above, a search for the minimum jitter value is begun with a specific area which, is selected in accordance with the type of disk mounted on the optical disk apparatus 500. This way, the area having the minimum jitter can be specified very rapidly, and thus the optimum frequency characteristic can be set in the waveform equalizer very rapidly.

In the second example, the cut-off frequency FC and the boost amount BST are used as variables x and y which can vary the jitter. Alternatively, variables x and y can be the high range group delay amount and the low range group delay amount, the tracking position and the focusing position, and the radial tilt and the tangential tilt. A structure and method for optimizing the frequency characteristic of the waveform equalizer using these as variables x and y are similar to those described above, and will not be described in detail.

EXAMPLE 3

Figure 21:
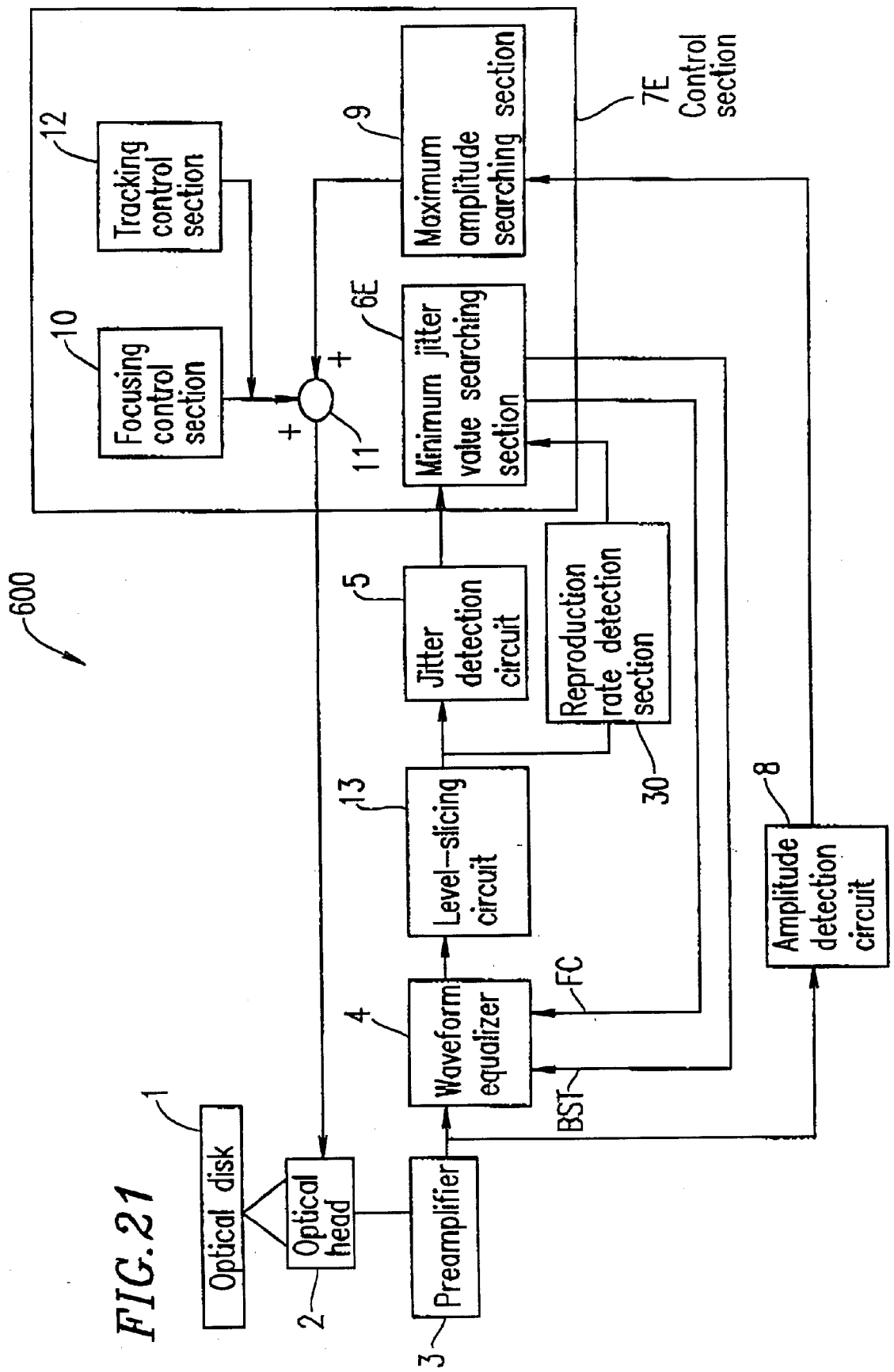
FIG. 21 is a block diagram illustrating an optical disk apparatus in a third first example according to the present invention.

FIG. 21 is a block diagram illustrating a structure of an optical disk apparatus 600 according to a third example of the present invention. Identical elements previously discussed with respect to FIG. 1 bear identical reference numerals and the detailed descriptions thereof will be omitted.

In one type of optical disk, information stored in an inner portion thereof is to be reproduced at one reproduction rate, and information stored in an outer portion thereof is to be reproduced at a different reproduction rate. For continuously reproducing the information in the inner portion and information in the outer portion of such an optical disk continuously, the optical disk apparatus 600 dynamically changes the reproduction rate. The optical disk apparatus 600 is used, for example, as a CAV reproduction apparatus.

The optical disk apparatus 600 generally performs as follows. An x-y plane, defined by variables x and y, as an initial area is divided into a plurality of first areas having an identical rectangular shape. Based on the reproduction rate detected by a reproduction rate detection circuit (described below), one of the plurality of first areas is selected. The selected first area is further divided into a plurality of second areas, each of which has a respective jitter measuring point at the center of gravity thereof. One of the plurality of second areas which has the jitter measuring point at which a minimum jitter is measured among the plurality of jitter measuring points is determined. This procedure can be repeated appropriately. Then, the optimum combination of variable x and variable y which correspond to the area which has been determined to have the minimum jitter is determined. Thus, an optimum characteristic of the waveform equalizer at each reproduction rate is determined.

Variables x and y can vary the jitter, and are determined in accordance with the address information or data frequency obtained from the disk mounted on the optical disk apparatus 600. In this example, variable x represents the cut-off frequency FC, and variable y represents the boost amount BST.

As shown in FIG. 21, the optical disk apparatus 600 includes an optical head 2 for directing an optical beam generated by a light source, such as, for example, a semiconductor laser to an optical disk 1 as an information carrier in a converged state, a preamplifier 3 for amplifying a reproduction signal corresponding to light reflected by the optical disk 1 and output by the optical head 2, a waveform equalizer 4 for waveform equalizing the reproduction signal amplified by the preamplifier 3, a level-slicing circuit 13 for level-slicing the reproduction signal waveform-equalized by the waveform equalizer 4, a jitter detection circuit 5 for detecting the jitter of the reproduction signal which has been level-sliced by the level-slicing circuit 13, an amplitude detection circuit 8 for detecting the amplitude of the reproduction signal amplified by the preamplifier 3, and a control section 7E for controlling the optical head 2 so that the optical beam directed from the optical head 2 to the optical disk 1 is in an optimum converged state.

The control section 7E includes a minimum jitter value searching section 6E for searching for the minimum value of the jitter detected by the jitter detection circuit 5, a maximum amplitude searching section 9 for searching for a focusing position at which the amplitude of the reproduction signal detected by the amplitude detection circuit 8 is maximum, a focusing control section 10 for executing focusing control so that the optical beam from the optical head 2 is in an optimum converged state on the optical disk 1, a tracking control section 12 for executing tracking control so that the optical beam from the optical head 2 correctly scans the track on the optical disk 1, and a synthesis circuit 11 for synthesizing a signal from the maximum amplitude searching section 9 with a focusing control signal from the focusing control section 10 and a tracking control signal from the tracking control section 12.

The optical disk apparatus 600 further includes a reproduction rate detection section 30 for detecting a reproduction rate of a reproduction signal based on an output from the level-slicing circuit 13.

The reproduction rate detection circuit 30 detects a frequency of a data signal which is input from the level-slicing circuit 13 and calculates a reproduction rate of the reproduction signal on the track of the optical disk 1 scanned by the optical beam. There are various specific techniques for calculating the reproduction rate. For example, the reproduction rate is obtained by detecting the cycle of the longest marks in the recording format or the cycle of the shortest marks in the recording format. Data which indicates the obtained reproduction rate is input to the control section 7E. The control section 7E switches the processing performed by the minimum jitter value searching section 6E based on the data indicating the reproduction, rate accordingly.

When performing CAV reproduction, the reproduction rate is about 2.5 times different at the maximum between an inner portion and an outer portion of the optical disk. For example, when the inner channel clock is 27 MHz, the outer channel clock is about 27 MHz×2.5=57.5 MHz.

The reproduction rate can be 16 times different among different types of optical disks. For example, while the reproduction rate of a CD audio is 1×, the read rate of a ROM can be 40× (inner portion: 16×).

In these cases, the signal frequency also changes by the same amount. Therefore the range set for the cut-off frequency FC of the waveform equalizer 4 can be determined by the reproduction rate. Therefore, an area of an x-y plane defined by the cut-off frequency FC and the boost amount BST, from which area division performed by the minimum jitter value searching section 6B is begun, can be pre-limited in accordance with the data indicating the reproduction rate. Thus, the optimum combination of the cut-off frequency FC and the boost amount BST can be rapidly determined.

FIGS. 22A, 22B and 22C illustrate a minimum jitter value searching method of the third example. In this example, the algorithm is switched so as to obtain an optimum frequency of the waveform equalizer 4 for an inner portion (channel clocks: 27 MHz), a middle portion (channel clock: 43 MHz), an outer portion (channel clock: 57.5 MHz) of the optical disk 1.

In FIGS. 22A, 22B and 22C, the horizontal axis represents the cut-off frequency FC, and the vertical axis represents the boost amount BST. For the sake of simplicity, the cut-off frequency FC and the boost amount BST are each variable in 8 steps.

FIGS. 22A, 22B and 22C each show an initial area A. FIG. 22A shows the initial area A which is used for information stored in an inner portion of the optical disk. FIG. 22B shows the initial area A which is used for information stored in a middle portion of the optical disk. FIG. 22C shows the initial area A which is used for information stored in an outer portion of the optical disk. The initial area A is divided into a plurality of (four in this example) first areas having an identical rectangular shape. Based on the reproduction rate detected by the reproduction rate detection section 30, one of the first areas is selected.

When the reproduction rate is detected as corresponding to a channel clock of 27 MHz and a maximum frequency of 4.5 MHz by the reproduction rate detection circuit 30, such a low reproduction rate is determined to be of an inner portion of the disk. Thus, the optical disk apparatus 600 operates as follows. As shown in FIG. 22A, a first area Z, which is a quarter of the initial area A having the lowest cut-off frequency FC, is selected from the four first areas and divided into second areas Z1, Z2, Z3 and Z4. The second areas Z1, Z2, Z3 and Z4 have boost amounts BST which are incremented by two. The jitter measuring points J1, J2, J3 and J4 are determined for the second areas Z1, Z2, Z3 and Z4, respectively. Then, the jitter is measured at the four jitter measuring points J1, J2, J3 and J4, and the second area having the smallest jitter is determined among the four second areas Z1, Z2, Z3 and Z4. When the jitter is equal at the four measuring points J1, J2, J3 and J4, the second area having the smallest jitter cannot be determined.

In such as case, the jitter is also measured at the jitter measuring point J0, which is at the center of the first area Z. When the jitter is equal at all five jitter measuring points J0, J1, J2, J3 and J4, the values of the cut-off frequency FC and the boost amount BST at the jitter measuring point J0 are determined as the optimum values.

The jitter in the area Z is shown by the jitter contour 205D shown in FIG. 4. According to the jitter characteristic shown by the jitter contour 205D, the jitter is minimum at the jitter measuring point J3 among the jitter measuring points J1, J2, J3 and J4. The optimization of the frequency characteristic of the waveform equalizer 4 for reproducing information in the inner portion of the disk is performed by setting the cut-off frequency FC and the boost amount BST corresponding to the jitter measuring point J3.

When the reproduction rate is detected as corresponding to a channel clock of 43 MHz and a maximum frequency of 7.1 MHz by the reproduction rate detection circuit 30, such a reproduction rate is determined to be of a middle portion of the disk. Thus, the optical disk apparatus 600 operates as follows. As shown in FIG. 22B, a first area Y, which is a quarter of the initial area A having a cut-off frequency FC of a value slightly higher than the middle value, is selected from the four first areas and divided into second areas Y1, Y2, Y3 and Y4. The second areas Y1, Y2, Y3 and Y4 have boost amounts BST which are incremented by two. The jitter measuring points J1, J2, J3 and J4 are determined for the second areas Y1, Y2, Y3 and Y4, respectively. Then, the jitter is measured at the four jitter measuring points J1, J2, J3 and J4, and the second area having the smallest jitter is determined among the four second areas Y1, Y2, Y3 and Y4. When the jitter is equal at the four measuring points J1, J2, J3 and J4, the second area having the smallest jitter cannot be determined.

In such a case, the jitter is also measured at the jitter measuring point J0, which is at the center of the first area Y. When the jitter is equal at all five jitter measuring points J0, J1, J2, J3 and J4, the values of the cut-off frequency FC and the boost amount BST at the jitter measuring point J0 are determined as the optimum values.

In the case where, for example, the jitter is minimum at the jitter measuring point J3 among the five jitter measuring points J0, J1, J2, J3 and J4, the optimization of the frequency characteristic of the waveform equalizer 4 for reproducing information in the middle portion of the disk is performed by setting the cut-off frequency PC and the boost amount BST corresponding to the jitter measuring point J3.

When the reproduction rate is detected as corresponding to a channel clock of 67.5 MHz and a maximum frequency of 11.25 MHz by the reproduction rate detection circuit 30, such a high reproduction rate is determined to be of an outer portion of the disk. Thus, the optical disk apparatus 600 operates as follows. As shown in FIG. 22C, a first area X, which is a quarter of the initial area A having the highest cut-off frequency FC, is selected from the four first areas and divided into second areas X1, X2, X3 and X4. The second areas X1, X2, X3 and X4 have boost amounts BST which are incremented by two. The jitter measuring points J1, J2, J3 and J4 are determined for the second areas X1, X2, X3 and X4, respectively. Then, the jitter is measured at the four jitter measuring points J1, J2, J3 and J4, and the second area having the smallest jitter is determined among the four second areas X1, X2, X3 and X4. When the jitter is equal at the four measuring points J1, J2, J3 and J4, the second area having the smallest jitter cannot be determined.

In such a case, the jitter is also measured at the jitter measuring point J0, which is at the center of the four second areas X1, X2, X3 and X4. When the jitter is equal at all five jitter measuring points J0, J3, J2, J3 and J4, the values of the cut-off frequency FC and the boost amount BST at the jitter measuring point J0 are determined as the optimum values.

In the case where, for example, the jitter is minimum at the jitter measuring point J2 among the five jitter measuring points J0, J3, J2, J3 and J4, the optimization of the frequency characteristic of the waveform equalizer 4 for reproducing information in the outer portion of the disk is performed by setting the cut-off frequency FC and the boost amount BST corresponding to the jitter measuring point J2.

With reference to FIG. 23, the processing performed by the control section 7B for optimizing the frequency characteristic of the waveform equalizer 4 will be described.

The reproduction rate detection section 30 detects the reproduction rate of the reproduction signal (step 1501). When the reproduction rate is detected to be low (i.e., an inner portion), the first area Z, which is a quarter of the initial area A having the lowest cut-off frequency FC, is selected and divided into second areas Z1, Z2, Z3 and Z4 having boost amounts BST which are incremented by two (step 1502). When the reproduction rate is detected to be middle (i.e., a middle portion), a first area Y, which is a quarter of the initial area A having a cut-off frequency FC of a value slightly higher than the middle value, is selected and divided into second areas Y1, Y2, Y3 and Y4 having boost amounts BST which are incremented by two (step 1503). When the reproduction rate is detected to be high (i.e., an outer portion), a first area X, which is a quarter of the initial area A having the highest cut-off frequency FC, is selected and divided into second areas X1, X2, X3 and X4 having boost amounts BST which are incremented by two (step 1504).

The jitter measuring points respectively in the four second areas are determined, and an equalization amount (i.e. the cut-off frequency FC and the boost amount BST) is set (step 1505). The jitter is measured at the five jitter measuring points J0, J1, J2, J3 and J4 (step 1506). The jitter measuring point at which the jitter is minimum is determined among the five jitter measuring points (step 1507).

It is determined whether or not the distance in the x direction and the y direction between the jitter measuring point J0 and each of the jitter measuring points J2 and J3 is 1, which is the minimum unit width (step 1508). When it is determined that the distance in the x direction and the y direction between the jitter measuring point J0 and each of the jitter measuring points J2 and J3 is not the minimum unit width (NO in step 1508), the processing goes back to step 1505. When it is determined that the distance in the x direction and the y direction between the jitter measuring point J0 and each of the jitter measuring points J2 and J3 is the minimum unit width (YES in step 1508), the jitter measuring point at which the measured jitter value is minimum among the five jitter measuring points is determined, and the equalization amount (i.e., the cut-off frequency FC and the boost amount BST) corresponding to that jitter measuring point is set (step 1509).

As described above, a search for the minimum jitter value is begun with a specific area which is selected in accordance with the reproduction rate of the reproduction signal detected by the reproduction rate detection section 30. This way, the area having the minimum jitter can be specified very rapidly, and thus the optimum frequency characteristic can be set in the waveform equalizer very rapidly.

In the third example, the reproduction rate is detected in an inner portion, a middle portion and an outer portion of the disk. Alternatively, a reproduction rate which is continuously varied can be constantly detected so as to update the optimum frequency of the waveform equalizer.

As described in the first example, variables x and y can be the high range group delay amount and the low range group delay amount, the tracking position and the focusing position, and the radial tilt and the tangential tilt. A structure and method for optimizing the frequency characteristic of the waveform equalizer using these as variables x and y are similar to those described above, and will not be described in detail.

In the third example, the reproduction rate detection circuit 30 detects the cycle (frequency) of a reproduction signal as the reproduction rate. Alternatively, the reproduction rate can be detected based on a radial position which is obtained from address information stored on the optical disk 1. The reproduction rate can also be detected based on a target rotation rate of the optical disk 1 using a command, or based on a frequency generator (FG) or the like of a motor for actually rotating the optical disk 1.

The optical disk apparatus 600 can be structured so that once the optimum frequency is set in the waveform equalizer 4 for the inner portion, the middle portion and the outer portion of the optical disk, the optimum frequency is stored in a memory or the like in the control section 7E. Then, each time a seek operation or a reproduction rate switching operation is instructed, the optimum frequency stored in the memory can be loaded and set in the waveform equalizer 4. Thus, the performance of the waveform equalizer 4 is improved. Even when reproduction of the information is impossible, such a structure does not prevent the minimum jitter value searching method according to the present invention from being performed again.

EXAMPLE 4

Figure 24:
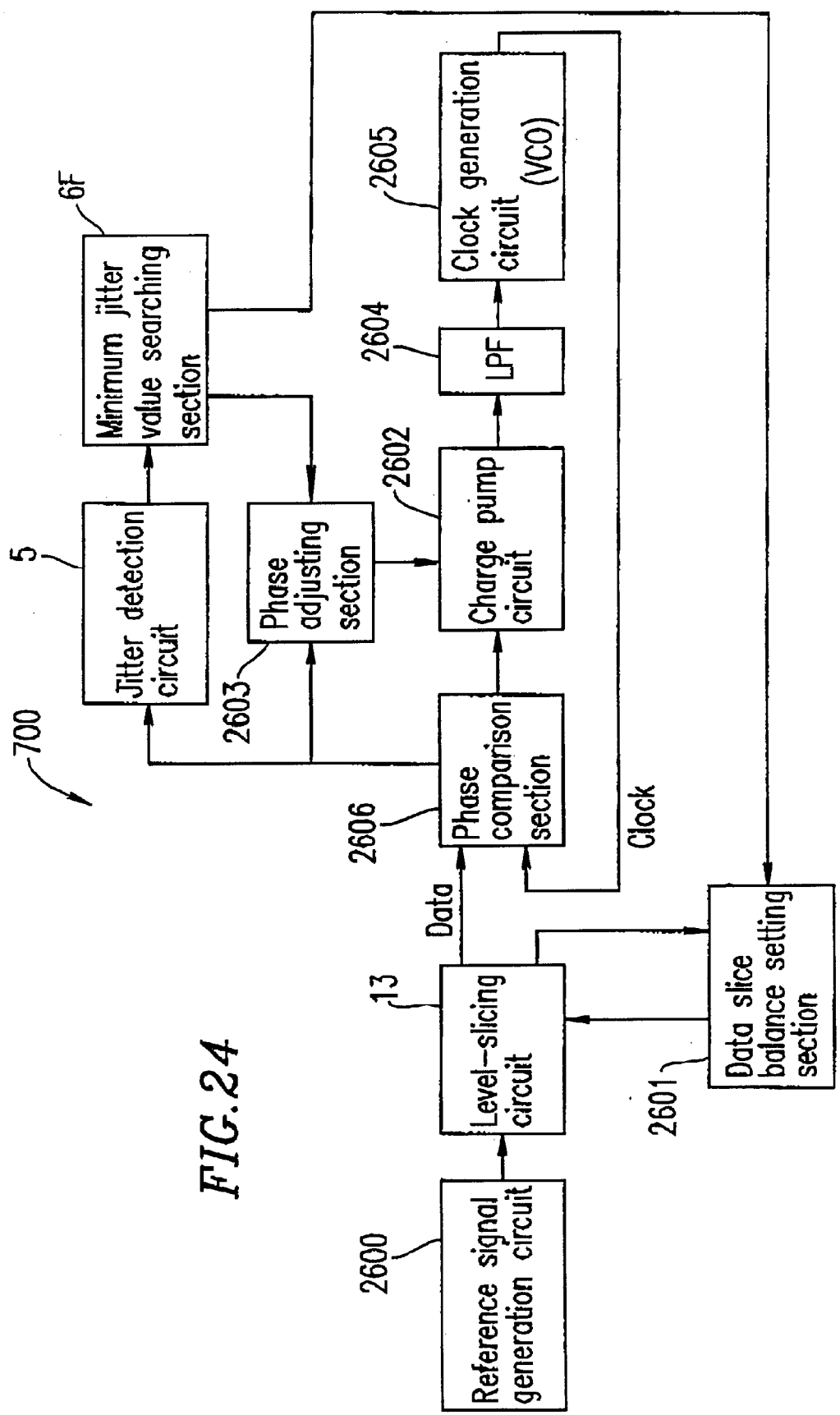
FIG. 24 is a block diagram illustrating a PLL circuit in a fourth example according to the present invention.

FIG. 24 is a block diagram illustrating a structure of a PLL circuit 700 according to a fourth example of the present invention. Identical elements previously discussed with respect to FIG. 1 bear identical reference numerals and the detailed descriptions thereof will be omitted.

The PLL circuit 700 is used to remove an offset in a data slice balance circuit. As shown in FIG. 24, the PLL circuit 700 includes a reference signal generation circuit 2600 for generating a monotonic signal which removes a circuit offset, a level-slicing circuit 13 for level-slicing the monotonic signal, a data slice balance setting section 2601 for setting the operation of the level-slicing circuit 13 so that a center of an amplitude of a signal can be level-sliced, a clock signal generation circuit 2605 for generating a clock signal, a phase comparison section 2606 for comparing a phase of the signal level-sliced by the level-slicing circuit 13 and a phase of the clock signal generated by the clock signal generation circuit 2605, a jitter detection circuit 5 for accumulating phase error signals, a charge pump circuit 2602 for averaging a phase error signal output from the phase comparison section 2606, a low pass filter (LPF) 2604 for supplying the clock signal generation circuit 2605 with a stable oscillation reference voltage from which an AC component output from the charge pump circuit 2602 has been removed, a phase adjusting section 2603 for adjusting a phase shift of the phase error signal, and a minimum jitter value searching section 6F.

The data slice balance setting section 2601 is provided for the following reason. In order to reproduce information from a mark or pit recorded on an optical disk 1, it is necessary to correctly read the length of the mark or pit. To realize this, it is desirable to set the center of the amplitude of a reproduction signal as the data slice level for level-slicing, since in this way the length of the mark or pit can be read correctly. The data slice level can also be controlled by integrating positive and negative pulses of the data level-sliced by the level-slicing circuit 13, but this is not sufficient since the level-slicing circuit 13 generally includes a circuit offset. Therefore, the data slice level needs to be fine-tuned by the data slice balance setting section 2601.

The phase adjusting section 2603 is provided for the following reason. The clock generation circuit 2605 is a voltage-controlled oscillation circuit for generating a clock signal which is variable in accordance with an oscillation reference voltage (control voltage). An oscillation reference voltage which is received by the clock generation circuit 2605 is obtained as follows. The signal level-sliced by the level-slicing circuit 13 and the clock signal generated by the clock signal generation circuit 2605 are compared with each other by the phase comparison section 2606. As a result, a phase error signal is output from the phase comparison section 2606. The phase error signal is averaged by the charge pump circuit 2602 and passed through the low pass filter 2604 so as to be stabilized in the PLL loop characteristic. The resultant signal is input to the clock generation circuit 2605.

The charge pump circuit 2602 accumulates and averages the phase error signal. The charge pump circuit 2602 increases or decreases a charge current based on how much the clock signal generated by the clock signal generation circuit 2605 is advanced or delayed with respect to the signal level-sliced by the level-slicing circuit 13. However, due to the influence of a transistor provided in an integrated circuit included in the charge pump circuit 2602, the absorbing characteristic and the discharging characteristic of a current which is output from the charge pump circuit 2602 are not symmetrical with each other. As a result, the current which is output from the charge pump circuit 2602 is unbalanced. As such, the oscillation reference voltage supplied to the clock signal generation circuit 2605 changes, and therefore the clock signal generated by the clock signal generation circuit 2605 and the signal level-sliced by the level-slicing circuit 13 are offset from each other in phase.

The phase adjusting section 2603 is provided for adjusting this phase shift. Specifically, the phase adjusting section 2603 can adjust the phase shift between the clock signal and the level-sliced signal by varying the current balance at the output stage included in the charge pump circuit 13. Alternatively, the phase adjusting section 2603 can adjust the phase shift by varying the current balance using an A/D converter (not shown) included therein.

When such a phase shift is generated, the jitter of the reproduction signal increases. It is necessary to search for the optimum phase adjusting amount while monitoring the jitter of the reproduction signal. However, when an attempt is made to set the data slice balance amount to the optimum value while monitoring the jitter of the reproduction signal, it may be difficult to find the optimum data slice balance amount due to small changes in the jitter with respect to the data slice balance amount.

In order to solve this problem, the optimum combination of the data slice balance amount and the phase adjusting amount at which the jitter is minimum is searched for while monitoring the jitter of the reproduction signal.

FIG. 25 is a graph illustrating the relationship between the phase adjusting amount and the data slice balance amount. A jitter contour 205H is obtained by connecting points of identical jitter when the phase adjusting amount and the data slice balance amount are varied.

Accordingly, the position at which the jitter is minimum in a plane defined by the horizontal axis representing the phase adjusting amount and the vertical axis representing the data slice balance amount is obtained. Thus, the optimum combination of the phase adjusting amount and the data slice balance amount can be set. The minimum jitter value searching method is similar to that described in the first example except that variable x represents the phase adjusting amount and variable y represents the data slice balance amount.

Figure 26:
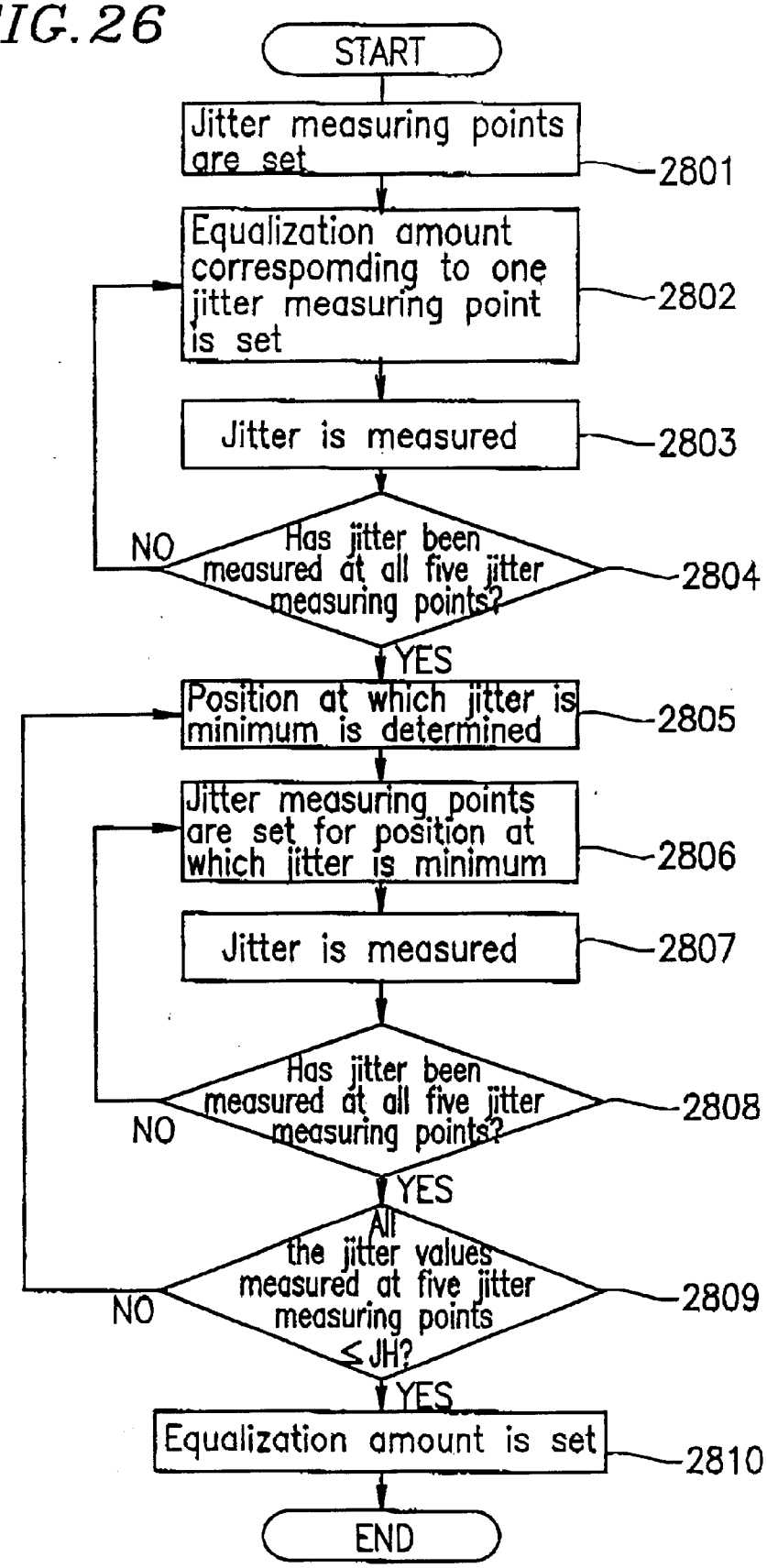
FIG. 26 is a flowchart illustrating a method for searching for an area where the jitter is minimum in the fourth example.
Figure 27:
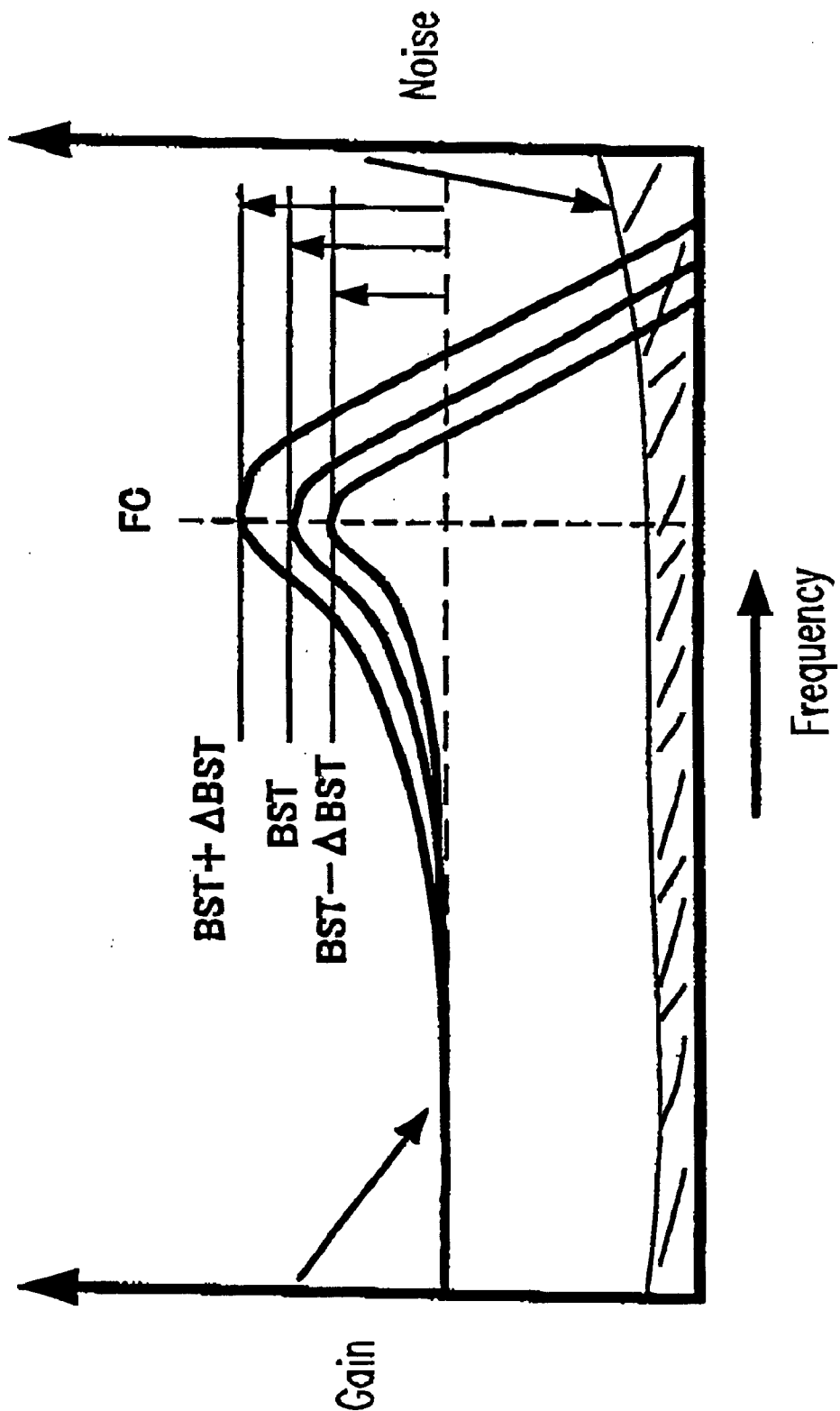
FIG. 27 is a graph illustrating the relationship between the gain, noise and frequency of a waveform equalizer of a conventional optical disk apparatus.
Figure 28:
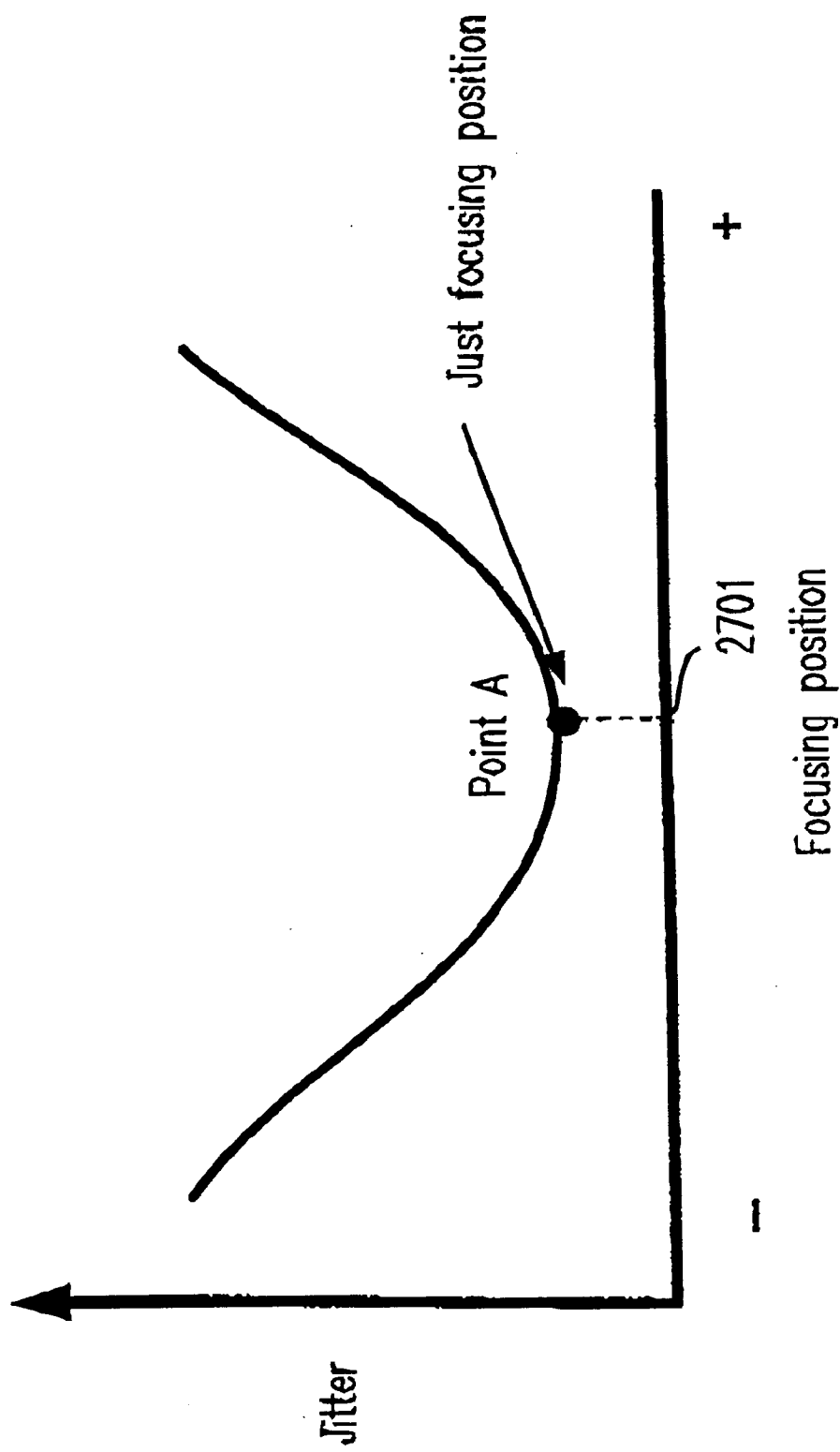
FIG. 28 is a graph illustrating the jitter characteristic with respect to a focusing position in the conventional optical disk apparatus.

FIG. 26 is a flowchart illustrating this minimum jitter value method.

Five jitter measuring points are set in an initial area (step 2801). The equalization amount (i.e., the phase adjusting amount and the data slice balance amount) corresponding to one of the jitter measuring points is set (step 2802). The jitter is measured based on the set phase adjusting amount and data slice balance amount (step 2803). It is determined whether or not the jitter has been measured at all five jitter measuring points (step 2804). When it is determined that the jitter has not been measured at all five jitter measuring points (NO in step 2804), the processing goes back to step 2802 in order to measure the jitter at the jitter measuring point or points at which the jitter has not been measured. When it is determined that the jitter has been measured at all five jitter measuring points (YES in step 2804), the jitter measuring point at which the jitter is minimum is determined among the five jitter measuring points (step 2805).

In a divided area of the initial area corresponding to the jitter measuring point at which the measured jitter value is minimum, five jitter measuring points are set (step 2806). The equalization amount (i.e., the phase adjusting amount and the data slice balance amount) corresponding to one of the jitter measuring points is set (step 2807). It is determined whether or not the jitter has been measured at all five jitter measuring points (step 2808). When it is determined that the jitter has not been measured at all five jitter measuring points (NO in step 2808), the processing goes back to step 2806 in order to measure the jitter at the jitter measuring point or points at which the jitter has not been measured. When it is determined that the jitter has been measured at all five jitter measuring points (YES in step 2808), it is determined whether or not all the jitter values measured at the five jitter measuring points are equal to or less than a prescribed set value JH, which represents the detection sensitivity of the jitter (step 2809). When it is determined that all the jitter values measured at the five jitter measuring points are not equal to or less than a prescribed set value JH (NO in Step 2809), the processing goes back to step 2805. When it is determined that all the jitter values measured at the five jitter measuring points are equal to or less than a prescribed set value JH (YES in step 2809), the jitter measuring point at which the measured jitter value is minimum is determined among the five jitter measuring points, and the phase adjusting amount and the data slice balance amount corresponding to the determined jitter measuring point are set (step 2810).

As described above, the present invention provides a highly reliable and high-speed optical disk apparatus for reproducing a plurality of types of optical disks and which is capable of switching the reproduction rate among a plurality of stages, which can shorten the start-up time and the read time. The present invention also provides an optical disk apparatus and a PLL circuit for efficiently and rapidly determining the combination of parameters at which the jitter is minimum.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical disk apparatus for optically reproducing information recorded on an information carrier by an optical beam emitted by a light source, the optical disk apparatus comprising:

a converging section for directing the optical beam to the information carrier in a converged state;

a light detection section for generating a reproduction signal corresponding to the optical beam reflected by or transmitted through the information carrier;

a waveform equalization section for varying a frequency characteristic of the reproduction signal generated by the light detection section;

a jitter measuring section for measuring a jitter of a signal output from the waveform equalization section; and a minimum jitter value searching section for determining a minimum value of the jitter in an initial area of an X-Y plane defined by a variable x and a variable y which can vary the jitter measured by the jitter measuring section;

wherein:

the minimum jitter value searching section divides the initial area into a plurality of first divided areas having an identical shape to each other, each of which has a respective first jitter measuring point at the center of gravity thereof; and performs a search operation to find one of the plurality of first divided areas which has the first jitter measuring point at which a minimum jitter is measured among the first jitter measuring points, and the minimum jitter value searching section divides the first divided area, having the first jitter measuring point at which the jitter is minimum, obtained by the search operation into a plurality of second divided areas having an identical shape to each other, each of which has a respective second jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second jitter measuring point at which the jitter is minimum found by the search operation.

2. An optical disk apparatus according to claim 1, wherein the minimum jitter value searching section divides the initial area into four first divided areas having an identical shape to each other, each of which has a respective first jitter measuring point at the center of gravity thereof; and performs a search operation to find one of the four first divided areas which has the first jitter measuring point at which a minimum jitter is measured among the first jitter measuring points, and the minimum jitter value searching section divides the first divided area obtained by the search operation into four second divided areas having an identical shape to each other, each of which has a respective second jitter measuring point at the center of gravity thereof; and performs a search operation to find one of the four second divided areas which has the second jitter measuring point at which a minimum jitter is measured among the second jitter measuring points.

3. An optical disk apparatus according to claim 1, wherein when a value of the jitter measured by the jitter measuring section is equal to or less than a prescribed value, the minimum jitter value searching section terminates the search operation.

4. An optical disk apparatus according to claim 1, wherein when the jitter measuring section is incapable of measuring the jitter in at least one of the first divided areas or at least one of the second divided areas, the jitter measuring section performs a search operation to find one of the plurality of first divided areas or one of the plurality of second divided areas which has the first or second jitter measuring point at which a minimum jitter is measured among the first or second jitter measuring points except for the area in which the jitter is incapable of being measured.

5. An optical disk apparatus according to claim 1, wherein the variable x includes a cut-off frequency, and the variable y includes a boost amount.

6. An optical disk apparatus according to claim 1, wherein the variable x includes a high frequency range group delay amount, and the variable y includes a low frequency range group delay amount.

7. An optical disk apparatus according to claim 1, further comprising:
a focusing control section for controlling the converging section so that the optical beam is converged on the information carrier in a prescribed converged state; and
a tracking control section for controlling the converging section so that the optical beam correctly scans a track on the information carrier;
wherein the variable x includes a tracking position, and the variable y includes a focusing position.

8. An optical disk apparatus according to claim 1, further comprising:
a radial tilt adjusting section for adjusting a radial tilt of the optical beam with respect to a surface of the information carrier; and a tangential tilt adjusting section for adjusting a tangential tilt of the optical beam with respect to the surface of the information carrier;
wherein the variable x includes a radial tilt, and the variable y includes a tangential tilt.

9. An optical disk apparatus for optically reproducing information recorded on an information carrier by an optical beam emitted by a light source, the optical disk apparatus comprising:
a converging section for directing the optical beam to the information carrier in a converged state;
a light detection section for generating a reproduction signal corresponding to the optical beam reflected by or transmitted through the information carrier;
a waveform equalization section for varying a frequency characteristic of the reproduction signal generated by the light detection section;
a jitter measuring section for measuring a jitter of a signal output from the waveform equalization section;
a minimum jitter value searching section for determining a minimum value of the jitter in an initial area of an X-Y plane defined by a variable x and a variable y which can vary the jitter measured by the jitter measuring section; and
an information carrier determination section for determining the type of the information carrier;
wherein:
the minimum jitter value searching section divides the initial area into a plurality of first divided areas having an identical shape to each other, and selects one of the plurality of first divided areas based on the type of the information carrier determined by the information carrier determination section, and
the minimum jitter value searching section divides the selected first divided area into a plurality of second divided areas having an identical shape to each other, each of which has a respective jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second jitter measuring point at which the jitter is minimum, found by the search operation.

10. An optical disk apparatus according to claim 9, wherein the minimum jitter value searching section divides the initial area into four first divided areas having an identical rectangular shape to each other, and selects one of the four first divided areas based on the type of the information carrier determined by the information carrier determination section, and the minimum jitter value searching section divides the selected first divided area into four second divided areas having an identical square shape to each other, each of which has a respective jitter measuring point at the center of gravity thereof; and performs a search operation to find one of the four second divided areas which has the second jitter measuring point at which a minimum jitter is measured among the second jitter measuring points.

11. An optical disk apparatus according to claim 9, wherein the variable x includes a cut-off frequency, and the variable y includes a boost amount.

12. An optical disk apparatus according to claim 9, wherein the variable x includes a high frequency range group delay amount, and the variable y includes a low frequency range group delay amount.

13. An optical disk apparatus according to claim 9, further comprising:
- a focusing control section for controlling the converging section so that the optical beam is converged on the information carrier in a prescribed converged state; and
- a tracking control section for controlling the converging section so that the optical beam correctly scans a track on the information carrier;
- wherein the variable x includes a tracking position, and the variable y includes a focusing position.

14. An optical disk apparatus according to claim 9, further comprising:
- a radial tilt adjusting section for adjusting a radial tilt of the optical beam with respect to a surface of the information carrier; and
- a tangential tilt adjusting section for adjusting a tangential tilt of the optical beam with respect to the surface of the information carrier;
- wherein the variable x includes a radial tilt, and the variable y includes a tangential tilt.

15. An optical disk apparatus for optically reproducing information recorded on an information carrier by an optical beam emitted by a light source, the optical disk apparatus comprising:
- a converging section for directing the optical beam to the information carrier in a converged state;
- a light detection section for generating a reproduction signal corresponding to the optical beam reflected by or transmitted through the information carrier;
- a waveform equalization section for varying a frequency characteristic of the reproduction signal generated by the light detection section;
- a jitter measuring section for measuring a jitter of a signal output from the waveform equalization section;
- a minimum jitter value searching section for determining a minimum value of the jitter in an initial area of an X-Y plane defined by a variable x and a variable y which can vary the jitter measured by the jitter measuring section; and
- a reproduction rate detection section for detecting a reproduction rate of a reproduction signal;
- wherein:
  - the minimum jitter value searching section divides the initial area into a plurality of first divided areas having an identical shape to each other, and selects one of the plurality of first divided areas based on the reproduction rate detected by the reproduction rate detection section, and
  - the minimum jitter value searching section divides the selected first divided area into a plurality of second divided areas having an identical shape to each other, each of which has a respective jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which corresponds to the second divided area, having the second measuring point at which the jitter is minimum, found by the search operation.

16. An optical disk apparatus according to claim 15, wherein the minimum jitter value searching section divides the initial area into four first divided areas having an identical rectangular shape to each other, and selects one of the four first divided areas based on the reproduction rate detected by the reproduction rate detection section, and
- the minimum jitter value searching section divides the selected first divided area into four second divided areas having an identical square shape to each other, each of which has a respective jitter measuring point at the center of gravity thereof; and performs a search operation to find one of the four second divided areas which has the second jitter measuring point at which a minimum jitter is measured among the second jitter measuring points.

17. An optical disk apparatus according to claim 15, wherein the variable x includes a cut-off frequency, and the variable y includes a boost amount.

18. A PLL circuit, comprising:
- a reference signal generation section for generating a monotonic signal;
- a level-slicing section for level-slicing the monotonic signal;
- a data slice balance setting section for setting an operation of the level-slicing section so as to level-slice a center of an amplitude of the monotonic signal;
- a clock generation section for generating a clock signal;
- a phase comparison section for comparing a phase of the monotonic signal which is level-sliced by the level-slicing section and a phase of the clock signal generated by the clock generation section so as to output a phase error signal;
- a charge pump circuit for averaging the phase error signal output by the phase comparison section;
- a phase adjusting section for adjusting a phase shift of the phase error signal output by the phase comparison section;
- a jitter measuring section for measuring a jitter based on the phase error signal output by the phase comparison section; and
- a minimum jitter value searching section for determining a minimum value of the jitter in an initial area in an X-Y plane defined by a variable x and a variable y which can vary the jitter measured by the jitter measuring section;
- wherein:
  - the minimum jitter value searching section divides the initial area into a plurality of first divided areas having an identical shape to each other, each of which has a respective first jitter measuring point at the center of gravity thereof; and performs a search operation to find one of the plurality of first divided areas which has the first jitter measuring point at which a minimum jitter is measured among the first jitter measuring points, and the minimum jitter value searching section divides the first divided area, having the first jitter measuring point at which the jitter is minimum, obtained by the search operation into a plurality of second divided areas having an identical shape to each other, each of which has a respective second jitter measuring point at the center of gravity thereof; performs a search operation to find one of the plurality of second divided areas which has the second jitter measuring point at which a minimum jitter is measured among the second jitter measuring points; and determines an optimum combination of the variable x and the variable y which correspond to the second divided area, having the second measuring point at which the jitter is minimum, found by the search operation.

19. A PLL circuit according to claim 18, wherein the variable x includes a cut-off frequency, and the variable y includes a boost amount.

20. A PLL circuit according to claim 18, wherein the phase adjusting section varies a current balance at an output stage included in the charge pump circuit so as to adjust the phase shift of the phase error signal which is output from the phase comparison section.

* * * * *